United States Patent [19]
Nakatani et al.

[11] Patent Number: 5,998,040
[45] Date of Patent: Dec. 7, 1999

[54] MULTILAYER WHICH SHOWS MAGNETORESISTIVE EFFECT AND MAGNETORESISTIVE ELEMENT USING THE SAME

[75] Inventors: Ryoichi Nakatani, Akikawa; Masahiro Kitada, Nishitama-gun; Yuzuru Hosoe, Hino, all of Japan

[73] Assignee: Hitachi, Ltd., Tokyo, Japan

[21] Appl. No.: 07/804,013

[22] Filed: Dec. 9, 1991

[30] Foreign Application Priority Data

Dec. 10, 1990 [JP] Japan .................................. 2-401027
May 15, 1991 [JP] Japan .................................. 3-110128

[51] Int. Cl.$^6$ ............................. H01F 1/00; B32B 15/20; G11B 5/66
[52] U.S. Cl. .................................. 428/611; 428/694 TM; 428/900; 428/928; 428/635; 428/672; 428/675
[58] Field of Search .................... 428/694, 900, 428/698, 704, 635, 611, 672, 675, 928, 694 TM

[56] References Cited

U.S. PATENT DOCUMENTS

| | | | |
|---|---|---|---|
| 4,477,794 | 10/1984 | Nomura et al. | 360/113 |
| 4,663,607 | 5/1987 | Kitada et al. | 360/113 |
| 4,783,711 | 11/1988 | Kitada et al. | 360/113 |

FOREIGN PATENT DOCUMENTS

| | | |
|---|---|---|
| 304280 | 2/1989 | European Pat. Off. . |
| 3507665 | 9/1986 | Germany . |
| 51-38885 | 3/1976 | Japan . |
| 52-67312 | 6/1977 | Japan . |
| 223681 | 1/1990 | Japan . |
| 261572 | 3/1990 | Japan . |
| 485500 | 9/1975 | U.S.S.R. . |

OTHER PUBLICATIONS

Shinjo et al, Journal of the Physical Society of Japan, vol. 59, No. 9, Sep. 1990, "Large Magnetoresistance of Field–Induced Giant Ferrimagnetic Multilayers".

Baibich et al, Physical Review Letters, vol. 61, No. 21, Nov. 21, 1988, "Giant Magnetoresistance of (001) Fe/ (001) Cr Magnetic Superlattices".

*Primary Examiner*—Valerie Lund
*Attorney, Agent, or Firm*—Beall Law Offices

[57] ABSTRACT

A magnetoresistive element uses a multilayer film where ferromagnetic layers and nonferromagnetic layers are layered on each other, wherein a permanent magnet layer is formed on the aforementioned multilayer film through one of the nonferromagnetic layers and a bias field is applied on the multilayer film.

36 Claims, 12 Drawing Sheets

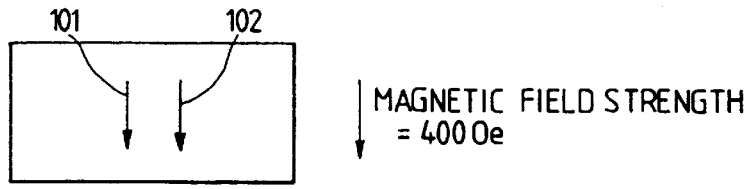
FIG. 10(a)  — MAGNETIC FIELD STRENGTH = 400 Oe
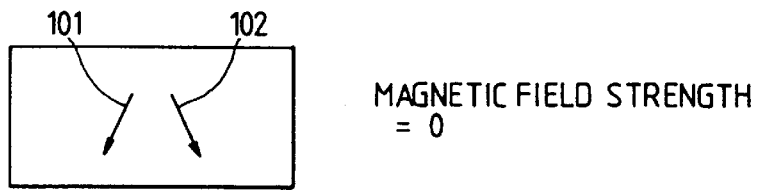
FIG. 10(b)  — MAGNETIC FIELD STRENGTH = 0
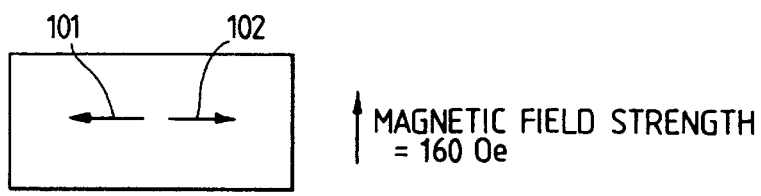
FIG. 10(c)  — MAGNETIC FIELD STRENGTH = 160 Oe
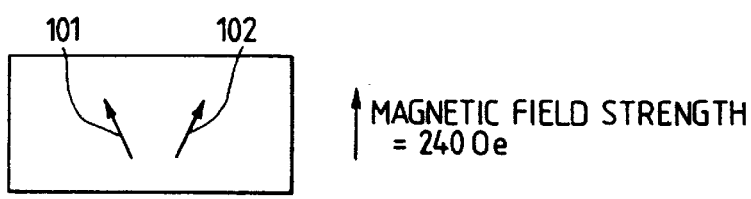
FIG. 10(d)  — MAGNETIC FIELD STRENGTH = 240 Oe
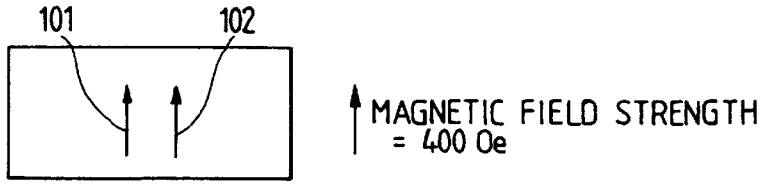
FIG. 10(e)  — MAGNETIC FIELD STRENGTH = 400 Oe

MULTILAYER WHICH SHOWS MAGNETORESISTIVE EFFECT AND MAGNETORESISTIVE ELEMENT USING THE SAME

BACKGROUND OF THE INVENTION

The present invention relates to a magnetic multilayer film having a high magnetoresistive effect, and more specifically to a multilayer film which shows the magnetoresistive effect in reading magnetic heads for use in magnetic disk apparatus.

As magnetic records have became highly dense, a material showing a high magnetoresistive effect is demanded for use in reading magnetic heads. The relative resistivity change of permalloy in current use is about 3%, and it is thus required that a new material should have a greater relative resistivity change exceeding this value.

As is shown in "Large Magnetoresistance of Field-Induced Giant Ferromagnetic Multilayers" which has been recently reported by Shinjo, et al., Journal of The Physical Society of Japan, Vol. 59, No.9, page 3061–3064, a relative resistivity change of 9.9% is observed in a magnetic film having a multilayer structure (Co/Cu/Ni—Fe/Co multilayer film).

As is shown in "Giant Magnetoresistance of (001)Fe/(001)Cr Magnetic Superlattices" described by Baibich, et al., Physical Review Letters, Vol. 61, No.21, page 2472–2475, the relative resistivity change is observed to be about 50% at 4.2K in a magnetic film having a multilayer structure (Fe/Cr multilayer film).

In the magnetic film having a multilayer structure described by Shinjyo, et al., however, the magnetic field strength required for the change in electric resistance is as large as about 50 Oe, so such a film has a problem in the sensitivity of magnetic fields when it is used as a sensor for detecting a weak magnetic field of magnetic heads.

In order to use a magnetic film having the aforementioned multilayer structure in magnetoresistive elements and magnetic heads, it is required that the resistance change should be large within the range in which outer magnetic fields are variable. Such a film has a problem in that a highly sensitive magnetoresistive element cannot be obtained, based only on the film structure described in the reference by Baibichi, et al.

Japanese Patent Laid-open Nos. 23681/1990 and 61572/1990 disclose other magnetoresistive elements in multilayer structure.

SUMMARY OF THE INVENTION

It is the objective of the present invention to solve the problems encountered at the application of multilayers which show the magnetoresistive effect to magnetic heads and to provide an excellent magnetic sensor.

The present inventors have investigated vigorously magnetic multilayer films in which ferromagnetic and nonferromagnetic layers, containing various materials and having different film thicknesses, are layered on each other. Consequently, it is found that the intensity of magnetoresistive effect varies depending on the types of the constituting materials and the film thickness. Thus, they have achieved the present invention. The term "nonferromagnetic layer" means a layer composed of materials which are not ferromagnetic (for example, nonferromagnetic materials).

Magnetoresistive effect can be observed in a multilayer film in which ferromagnetic layers and nonferromagnetic layers are layered on each other, by imparting to the multilayer film two or more types of ferromagnetic layers differing in coercive force or anisotropy field.

In accordance with the present invention, in a magnetoresistive element employing a multilayer film in which ferromagnetic layers and nonferromagnetic layers are layered on each other, a permanent magnet layer is formed through a nonferromagnetic layer on the multilayer film, thereby applying a bias field on the multilayer film.

It is herein preferable that the absolute value of the bias field applied on the multilayer film is lower than the value of the magnetic field where the electrical resistance of the multilayer film is at maximum and that the direction thereof is inverse to the magnetization direction of the permanent magnet.

In accordance with another aspect of the present invention, in a magnetoresistive element employing a multilayer in which ferromagnetic layers and nonferromagnetic layers are layered on each other, a nonferromagnetic metal layer is formed through a nonmagnetic insulating layer, to make an electric current flow in the nonmagnetic metal layer thereby applying a bias field on the multilayer film.

In accordance with a further aspect of the present invention, in a magnetoresistive element employing a multilayer in which ferromagnetic layers and nonferromagnetic layers are layered on each other, the angle between the hard axis direction of the multilayer film and the direction of detecting an outer magnetic field in the state with no bias field applied is constituted at 10° or less In accordance with a still further aspect of the present invention, in a magnetoresistive element employing a multilayer in which ferromagnetic layers and nonferromagnetic layers are layered on each other, a bias field is applied so that the angle between the magnetization direction of the multilayer film and the direction of detecting an outer magnetic field in the state without any outer magnetic field applied might be constituted at 30 to 70°.

In the magnetoresistive element of the present invention, the ferromagnetic layers preferably contain a first layer and a second layer different from the first layer in terms of at least one magnetic property selected from coercive force and anisotropy field.

A multilayer which shows a relatively high magnetoresistive effect can be obtained by using Ni or Ni alloy as a ferromagnetic layer. When Ni alloy is further defined as Ni—Cu, Ni—Ag, Ni—Au, Ni—Fe—Cu, Ni—Fe—Ag, or Ni—Fe—Au alloy, a still higher magnetoresistive effect can be obtained.

When Co-based amorphous alloy is used as a part of the ferromagnetic layers, a multilayer which shows the magnetoresistive effect at the application of a lower magnetic field can be obtained.

When a permanent magnet is used as a part of the ferromagnetic layers, the magnetization process has lost hysteresis, giving a preferable property to such a multilayer as a sensor of a magnetic field. The coercive force of a permanent magnet is preferably 100 Oe or more, if a magnetic field to be applied to a magnetic head is taken into account. It is also preferable for the realization of a magnetization process with no hysteresis to magnetize the permanent magnet prior to the use of a magnetoresistive element.

A further higher magnetoresistive effect can be obtained by inducing epitaxial growth in at least a part of the interface between a ferromagnetic layer and a nonferromagnetic layer.

In order to induce epitaxial growth, the difference in lattice parameter between a ferromagnetic layer and a nonferromagnetic layer is preferably 5% or less, on the basis of the lattice parameter of the ferromagnetic layer.

A higher magnetoresistive effect can be obtained when the film thickness of a nonferromagnetic layer is 4 to 10 nm.

A further higher magnetoresistive effect can be obtained when the film thickness of a ferromagnetic layer is 2 to 10 nm.

When the coercive force of a ferromagnetic layer varies, there can be obtained a multilayer which shows the magnetoresistive effect and which is provided with excellent high-frequency properties, by setting the angle between the easy axis direction of a ferromagnetic layer with a relatively high coercive force and the easy axis direction of a ferromagnetic layer with a relatively low coercive force at 75 to 90°.

When an anisotropy field of a ferromagnetic layer varies, a multilayer which shows the magnetoresistive effect and has excellent high-frequency properties can be obtained by setting the angle between the easy axis direction of a ferromagnetic layer with a relatively high coercive force and the easy axis direction of a ferromagnetic layer with a relatively low coercive force at 75 to 90°.

Using the aforementioned multilayer which shows the magnetoresistive effect, a magnetoresistive element with excellent properties can be obtained. By applying a bias field on the magnetoresistive element, a magnetoresistive element having a high sensitivity and enabling the judgment of the magnetic-field direction, whether it is positive or negative in the region of a magnetic field can be obtained. The technique concerning bias is applicable to magnetic tunneling junction elements. In other words, in a magnetoresistive element employing a multilayer having a magnetoresistive effect derived from the multilayer structure in which ferromagnetic layers and nonferromagnetic layers are layered on each other, a highly sensitive magnetoresistive element enabling the judgment of the direction (positive or negative) of an outer magnetic field can be obtained, by applying a bias field on the magnetoresistive element. As methods for applying a bias field, there can be used one process selected from a shunt bias method, an inductive field method with electric current, a permanent magnet method, a soft film method and an exchange bias method, or a combination of the two or more.

Magnetoresistive elements may sometimes show the magnetization process with hysteresis. In such case, a mechanism in order to apply a magnetic field is preferably added to the magnetoresistive elements outwardly whereby the magnetoresistive elements are initialized. When magnetoresistive elements are also used as magnetic heads, those with excellent properties can be obtained. By aligning the hard axis direction of a magnetic layer of a magnetic field with a relatively low coercive force and a low anisotropy field, in the vertical direction of the surface of a magnetic recording medium, a magnetic head with an excellent high-frequency property can be produced.

By limiting the film thickness of a nonferromagnetic layer, an exchange coupling is interposed between ferromagnetic layers, whereby the multilayer film can be used as a sensor of a magnetic field without a bias field. Therefore, the thickness per layer of nonferromagnetic layers is preferably 1.5 to 2.5 nm. By setting the angle between the easy axis direction of the multilayer film and the direction of detecting an outer magnetic field in the state with no bias field applied at almost a right angle, a magnetoresistive element with an excellent high-frequency property can be obtained. By setting the angle, in the state without a bias field applied, between the magnetization direction of the multilayer film and the direction of detecting an outer magnetic field at 30 to 70°, a more highly sensitive magnetoresistive element can be obtained.

By further preparing the film thickness of a multilayer film having magnetoresistive effect at 11.5 to 100 nm, a magnetoresistive element can be obtained in which a high sense current can flow. When the film thickness of a multilayer film is furthermore prepared at 11.5 to 50 nm, a still higher sense current can flow.

It is preferable that two magnetoresistive elements exist in a magnetoresistive element employing a multilayer film in which ferromagnetic layers and nonferromagnetic layers are layered on each other and that the difference in voltage between the two magnetoresistive elements is output.

It is preferable that the diffusion layer between the ferromagnetic layers and the nonferromagnetic layers is 0.3 nm or less.

It is also preferable that at least a part of such multilayer film is formed on a metal layer.

These characteristic features of the present invention are effective alone, and more effective in combination.

BRIEF DESCRIPTION OF THE DRAWINGS

FIG. 10 represents views explaining the working principle of a multilayer magnetic film of the present invention;

DETAILED DESCRIPTION OF THE PREFERRED EMBODIMENTS

The present invention will now be explained with respect to one embodiment of the present invention. With reference to drawings, further explanation will follow in a concrete manner.

EXAMPLE 1

Figure 1:
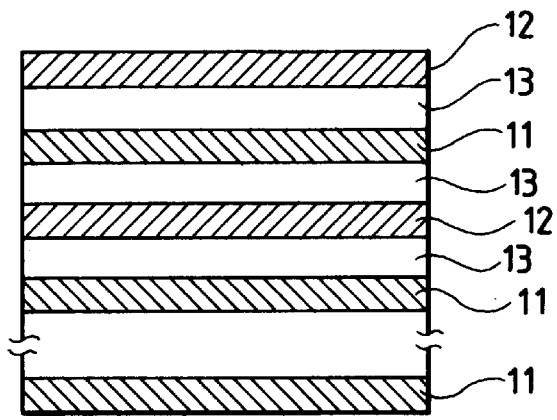
FIG. 1 is a cross sectional view of a multilayer magnetic film.

A vacuum deposition method was employed for the preparation of a multilayer which showed the magnetoresistive effect. The base pressure of the apparatus was $1/10^8$ Pa; and the deposition rate of the film was 0.2 to 0.6 nm/s. At film deposition, a magnetic field of 250 Oe was applied in parallel to the film surface. Corning Glass 7059 manufactured by Corning Co. Ltd, was used as a substrate. The cross-sectional structure of the multilayer which shows the magnetoresistive effect is shown in FIG. 1. In the figure, ferromagnetic layer 11 is different from ferromagnetic layer 12 in terms of coercive force.

In the present example, a multilayer similar to those described as "Large Magnetoresistance of Field-Induced Giant Ferromagnetic Multilayers" by Shinjyo, et al., Journal of The Physical Society of Japan, supra., namely, Co (3 nm)/Cu (5 nm)/Ni—Fe (3 nm)/Cu (5 nm), was layered at 10 periods. That is, there were used Co as ferromagnetic layer 11, Ni—Fe alloy as ferromagnetic layer 12, and nonmagnetic Cu as nonferromagnetic layer 13. According to the present invention, there was fabricated a multilayer in which 10 periods of Ni—Pt (3 nm)/Cu (5 nm)/Ni—Fe (3 nm)/Cu (5 nm) were layered. That is, there were used Ni—Pt alloy as ferromagnetic layer 11, Ni—Fe alloy as ferromagnetic layer 12, and Cu as nonferromagnetic layer 13. The Fe concentration is 20 at % in the Ni—Fe alloy; the Pt concentration is 18 at % in the Ni—Pt alloy.

Figure 2:
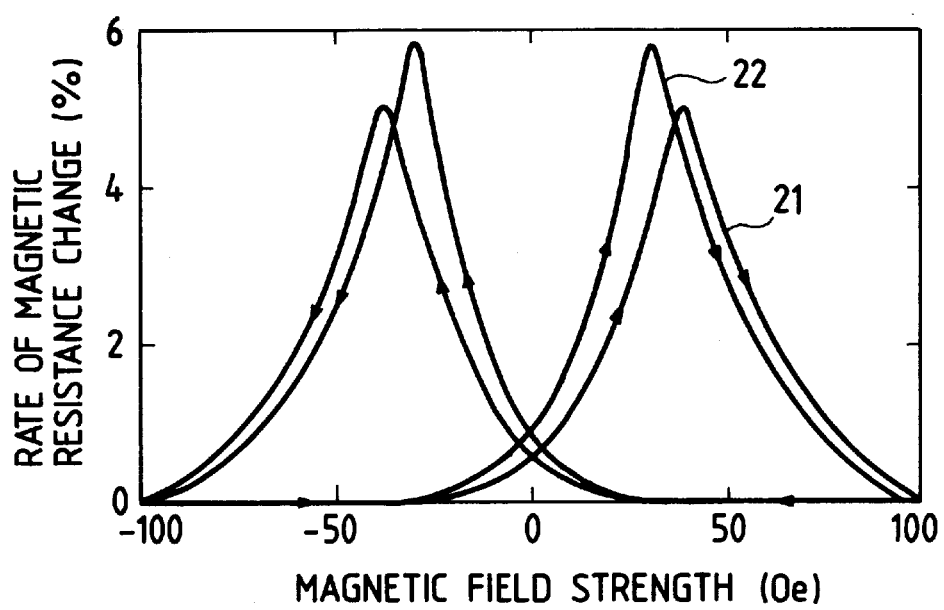
FIG. 2 represents comparison graphs depicting the relation between the magnetic field and the rate of magnetic resistance change (ie. relative resistivity change) of a multilayer film constructed according to the teachings of the present invention.

The magnetoresistive effect of a conventional sample and that of a sample of the present invention were measured. The results are shown in FIG. 2. The relative resistivity change (ie. the rate of magnetic resistance change) of the magnetoresistive effect 21 of the conventional multilayer film was 5.0%. The value is smaller than the values shown in the reference described above, which is due to the fact that multilayers are layered at 10 periods in the present example while multilayers are layered at 15 periods in the reference, and that a magnetic field as low as 100 Oe is applied in the present example while a magnetic field of 3,000 Oe is applied at maximum before the measurement. However, the relative resistivity change of 5% is larger than the 3% for the permalloy as a currently practical material.

Figure 3A:
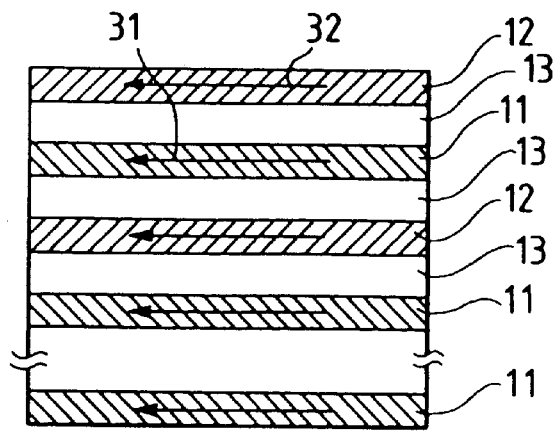
FIG. 3 represents cross sectional views depicting the working principle of a multilayer magnetic film of the present invention.

In the multilayer film described above, the magnetoresistive effect is exhibited based on the mechanism described hereinbelow. The multilayer which shows the magnetoresistive effect has two types of ferromagnetic layers having different coercive forces as shown in FIG. 1. When a higher magnetic field than the coercive force of the two types of magnetic layers is applied in the negative direction, both of the two types of ferromagnetic layers are saturated magnetically. Such a state is shown in FIG. 3(a). The magnetization 31 of the ferromagnetic layer 11 and the magnetization 32 of the ferromagnetic layer 12 are in the same direction then. When the electrons present in ferromagnetic layer 11, for example, pass through nonferromagnetic layer 13 to be incident into ferromagnetic layer 12, the electrons are not much scattered in such a state, so that the electrical resistance is low.

The same is true in the case that the electrons present in ferromagnetic layer 12 pass through nonferromagnetic layer 13 to be incident into ferromagnetic layer 11. Starting from such a state, the magnetic field is once down to zero, followed by further application thereof in the positive direction. Then, the magnetization 32 of ferromagnetic layer 12 is inversely magnetized with the coercive force of ferromagnetic layer 12, to be aligned in the direction of the magnetic field.

Figure 3B:
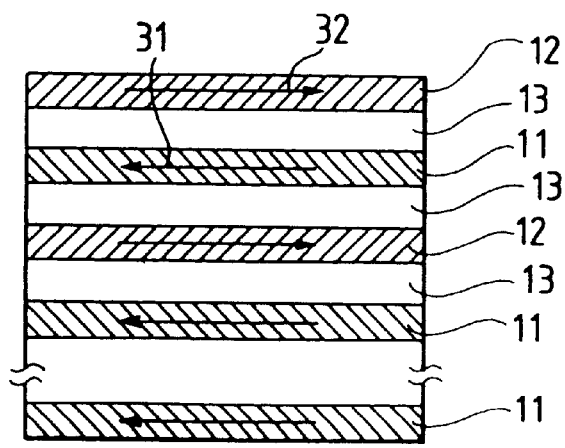
Figure 3C:
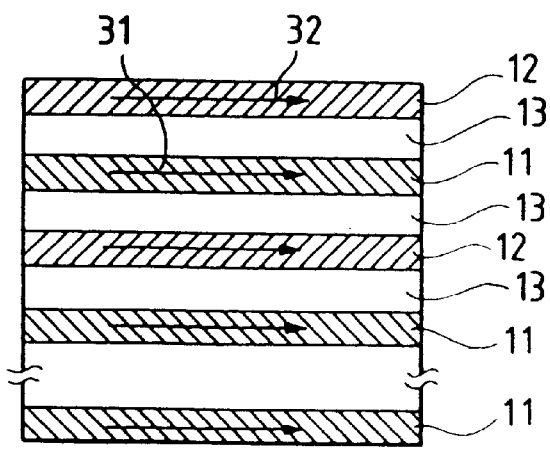

As is shown in FIG. 3(b), however, the magnetization 31 of ferromagnetic layer 11 is not inversely magnetized because the magnetic field is lower than the coercive force of ferromagnetic layer 11, so that the magnetization 31 still holds the original direction. Hence, the magnetization direction 31 of ferromagnetic layer 11 and the magnetization direction 32 with the coercive force of ferromagnetic layer 12 are anti-parallel. When in such a state the electrons present in ferromagnetic layer 11, for example, pass through nonferromagnetic layer 13 to be incident into ferromagnetic layer 12, the electrons are scattered so electrical resistance becomes higher. The same is true in the case that the electrons present in ferromagnetic layer 12 pass through nonferromagnetic layer 13 to be incident into ferromagnetic layer 11. If the magnetic field further increases higher than the coercive force of ferromagnetic layer 11, the magnetization direction 31 of ferromagnetic layer 11 is inverted and then becomes parallel to the magnetization direction 32 of ferromagnetic layer 12, so that electrical resistance is again lowered.

It is indicated that the magnetoresistive effect 22 of the multilayer film of the present invention is exhibited, possibly based on the same phenomenon. However, the magnetoresistive effect 22 of the multilayer film of the present invention is larger than the magnetoresistive effect 21 of the multilayer film of the conventional example. It is indicated that this is because Ni alloy is incorporated in the magnetic layer of the multilayer which shows the magnetoresistive effect, in accordance with the present invention, and therefore, the band polarization on the Fermi surface of the magnetic layer is larger than the polarization in the case that Co is incorporated, leading to a higher scattering probability when the magnetization directions are anti-parallel.

As is described hereinafter, Ni alloy and Cu are both in face-centered cubic structure, so the lattice parameters thereof are different by only about 1.8%. Therefore, epitaxial growth is induced at the interface of magnetic layers and nonmagnetic layers, resulting in the difficulty of the outset of defects in the magnetic layers and the hard occurrence of electron scattering due to such defects, which is regarded as one of the factors causing the development of high magnetoresistive effect. In the case that Co or Co alloy and Cu are employed as magnetic layers and nonmagnetic layers, respectively, it is hinted from the respect of such phenomenon to practice another method comprising rendering the film thickness of Co layer to be relatively thin to induce forced epitaxial growth, and preparing the film in face-centered cubic structure. Practically, such a multilayer which showed magnetoresistive effect gave the relative resistivity change of 5.5%.

The same results can be obtained as in the present example, provided that the same film structure can be formed, even if other methods besides vacuum deposition may be adopted.

In the above example, a multilayer which shows the magnetoresistive effect and incorporates ferromagnetic layers with different coercive forces has been described. The same effect can be brought about when ferromagnetic layers with different anisotropy fields are employed. The same effect can be obtained also, only if other materials than those described above are Ni alloys.

EXAMPLE 2

According to the same method as in Example 1, a multilayer which showed the magnetoresistive effect was formed. There were used Ni—18 at % Pt of a film thickness of 3 nm as ferromagnetic layer 11; an alloy layer selected from Ni, Ni—Fe, Ni—Cu, Ni—Ag, Ni—Au, Ni—Fe—Cu, Ni—Fe—Ag, and Ni—Fe—Au alloys, all alloys being of a film thickness of 3 nm, as ferromagnetic layer 12; and Cu of a film thickness of 5 nm as nonferromagnetic layer 13.

The change of magnetoresistive effect depending on the materials of ferromagnetic layer 12 is shown in Table 1. The concentrations of Cu, Ag and Au in Ni—Cu, Ni—Ag and Ni—Au alloys, respectively, are about 5 at %. The concentration of Fe in Ni—Fe, Ni—Fe—Cu, Ni—Fe—Ag and Ni—Fe—Au alloys is about 20 at %; and the concentrations of Cu, Ag and Au are about 5 at %. As is shown in the Table, a higher magnetoresistive effect can be obtained by using the alloys in which Cu, Ag and Au are added to Ni—Fe alloy than by using Ni—Fe alloy of itself. A higher magnetoresistive effect can be obtained by using the alloys in which Cu, Ag and Au are added to Ni than by using Ni alone. It is considered that this is possibly because the addition of Cu, Ag and Au induces the supply of the electrons thereof to Ni, which electrons fill the majority band of Ni, leading to a larger band polarization.

TABLE 1

| Material of magnetic layer 12 | Maximum relative resistivity change |
| --- | --- |
| Ni | 4.0 |
| Ni—Cu | 4.8 |
| Ni—Ag | 4.5 |
| Ni—Au | 4.5 |
| Ni—Fe | 5.8 |
| Ni—Fe—Cu | 6.5 |
| Ni—Fe—Ag | 6.1 |
| Ni—Fe—Au | 6.3 |

The same results as in the present example can be obtained provided that the same film structure is formed, even if other methods besides vacuum deposition are employed.

In the above example, the multilayer which showed the magnetoresistive effect and incorporated ferromagnetic layers with different coercive forces has been described. The same effect can be brought about when ferromagnetic layers with different anisotropy fields are employed.

EXAMPLE 3

Following the same method as in Example 1, a multilayer which showed the magnetoresistive effect was formed. There were used Co of a film thickness of 3 nm and Co-based amorphous alloy of a film thickness of 3 nm as ferromagnetic layers 11 and 12, respectively, and Cu of a film thickness of 5 nm as nonferromagnetic layer 13, in FIG. 1. As a comparative example, a multilayer which showed the magnetoresistive effect and incorporated Ni—20 at % Fe alloy in ferromagnetic layer 12 was formed. Table 2 shows the changes of the coercive force of the materials of ferromagnetic layer 12 and the magnetic field lip where the resistance of the materials reached maximum.

TABLE 2

| Material of magnetic layer 12 | Coercive force of magnetic layer 12 (Oe) | Magnetic field with maximum electric resistance |
| --- | --- | --- |
| Ni—Fe | 5.1 | 38 |
| $Co_{90}Nb_5Zr_5$ | 1.8 | 15 |
| $Co_{88}Mo_5Zr_7$ | 1.6 | 15 |
| $Co_{90}W_4Zr_6$ | 2.5 | 23 |
| $Co_{92}Ta_5Zr_5$ | 2.2 | 20 |

As is shown in Table 2, the coercive force of Ni—20 at % Fe alloy layer in the multilayers is 5.1 Oe. On the contrary, the coercive force of Co-based amorphous alloy layer is as low as 1.6 to 2.5 Oe. Crystalline alloy layers such as Ni—Fe alloy layer frequently show deteriorated soft magnetic properties due to the deteriorated crystallinity thereof when the alloy layer is formed on an unsmooth layer. However, a Co-based amorphous alloy layer shows good a soft magnetic property due to the noncrystalline structure thereof when the alloy layer is formed on an unsmooth layer. The magnetic anisotropy is also likely to be added because of the vacuum deposition in magnetic fields. Therefore, a Co-based amorphous alloy layer is considered to have a relatively lower coercive force in the multilayer which shows the magnetoresistive effect in accordance with the present example.

In the case that a Ni—20 at % Fe alloy layer is used, the magnetic field Hp where the resistance reaches maximum is 38 Oe. Alternatively, when a Co-based amorphous alloy layer is used, the Hp gets smaller, on the order of 23 Oe. This is because the coercive force of the Co-based amorphous alloy layer is lower than the coercive force of the Ni—Fe alloy layer.

As has been described, a multilayer which shows the magnetoresistive effect at a relatively lower magnetic field can be obtained when Co-based amorphous alloy is used in at least a part of the ferromagnetic layer. When such a multilayer is used in a magnetic field sensor such as a magnetic head, it is preferable that such a multilayer shows the magnetoresistive effect at a low applied magnetic field.

The same results as in the present example can be obtained provided that the same film structure is formed, even if other methods besides vacuum deposition are employed.

In the above example, the multilayer which shows the magnetoresistive effect and incorporates ferromagnetic layers with different coercive forces has been described. The same effect can be brought about when ferromagnetic layers with different anisotropy fields are employed.

By using Co-based amorphous alloy in at least a part of the ferromagnetic layers, the same effect can be brought about in multilayers other than those shown in Table 2.

EXAMPLE 4

Following the same method as in Example 1, a multilayer which showed the magnetoresistive effect was formed. There were used Co—20 at % Pt of a film thickness of 3 nm and Ni—20 at % Fe alloy of a film thickness of 3 nm, as ferromagnetic layers 11 and 12, respectively, and Cu of a film thickness of 5 nm as nonferromagnetic layer 13, as are shown in FIG. 1. Prior to the measurement of the magnetoresistive effect, a magnetic field of 10 kOe was applied in the easy axis direction of the multilayer which showed the magnetoresistive effect. Subsequently, the magnetic field was removed.

Figure 4:
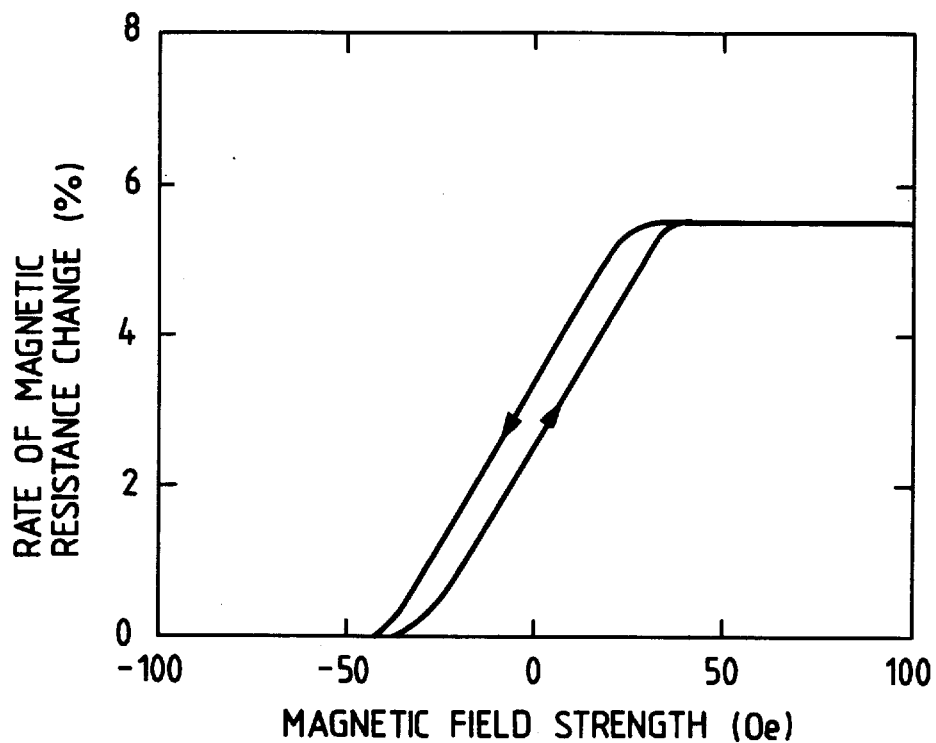
FIG. 4 represents graphs depicting the relation between the magnetic field and the rate of magnetic resistance change for a multilayer film constructed according to the teachings of the present invention.

The results of measuring the magnetoresistive effect are shown in FIG. 4. The figure shows a distinctively different graph from the results in Example 1, which are shown in FIG. 2. This is because the ferromagnetic layer 11 of the present example is a permanent magnet showing a coercive force of 800 Oe, so that the magnetization thereof is not inverted even if a magnetic field of about 100 Oe is applied at the measurement. As the change of electrical resistance depends on the change of the magnetization of Ni—Fe alloy layer, the curve of the resistance change takes a form similar to the magnetization curve of the Ni—Fe alloy layer.

When a magnetic field gets far above the magnetic field at which the resistance is maximized in the multilayer demonstrating the curves of resistance change such as the curves in FIG. 2, the resistance does not change unless a larger magnetic field is applied in an inverse direction. It is required for a magnetic field sensor that an equal resistance should be shown at an equal strength of a magnetic field. Accordingly, the multilayer which shows magnetic resistance per se as shown in FIG. 2 cannot be used as a sensor.

On the contrary, the multilayer which shows the magnetoresistive effect of the present invention shows a change of the resistance without hysteresis, as shown FIG. 4. Therefore, the multilayer of the present invention can be used as a magnetic field sensor. If a magnetic field is applied in the hard axis direction of the ferromagnetic layer 12 with a low coercive force or a low anisotropy magnetic field, the magnetization process of magnetic layer 12 does not show hysteresis. Thus, the resistance changes absolutely without any hysteresis is. Based on this, it is preferable that a permanent magnet be used in at least a part of the ferromagnetic layers and that the permanent magnet be magnetized, when multilayers which show the magnetoresistive effect are used as magnetic field sensors. It is more preferable for a magnetic field sensor to be used so that an outer magnetic field might be applied in the hard axis direction of a soft magnetic layer.

The strength of a magnetic field incident to a magnetic head is considered as 100 Oe or less, which indicates that the coercive force of the permanent magnet is preferably 100 Oe or more.

The same results as in the present example can be obtained provided that the same film structure is formed, even if other methods besides vacuum deposition are employed.

In the above example, the multilayer which shows the magnetoresistive effect and incorporates ferromagnetic layers with different coercive forces has been described. The same effect can be brought about when ferromagnetic layers with different anisotropy fields are employed. If a permanent magnet other than Co—20 at % Pt is used, the same results as described above can be obtained.

When the multilayer which shows the magnetoresistive effect of the present invention is used as a magnetoresistive element, a high magnetoresistive effect at high frequencies may sometimes be required. Then, a magnetic field should enter in a hard axis direction with excellent high-frequency properties in a layer with a relatively low coercive force. In a layer with a relatively high coercive force, a magnetic field may preferably enter in an easy axis direction with excellent rectangular hysteresis, because it is preferable that the direction of magnetization does not change. That is, the easy axis direction of a layer with a relatively low coercive force and that of a layer with a relatively high coercive force preferably make almost a right angle. If the angle between the easy axis directions of the two layers is then 75 to 90°, substantially the same results are obtained as in the case that the angle is almost vertical. The effect can be also obtained from multilayers which show the magnetoresistive effect in which the two layers are of the types having different anisotropy fields. This is because coercive force and anisotropy field are correlated with each other.

EXAMPLE 5

According to the same method as in Example 1, a multilayer which showed the magnetoresistive effect was formed. There were used Co of a film thickness of 3 nm and Ni— Fe alloy of a film thickness of 3 nm, as ferromagnetic layers 11 and 12, respectively, and various metals of a film thickness of 5 nm as nonferromagnetic layer 13, as are shown in FIG. 1. The relative resistivity change depending on the materials of nonferromagnetic layer 13 is shown in Table 3.

TABLE 3

| Nonferromagnetic layer | Lattice mismatch between nonferromagnetic layer and ferromagnetic layer (%) | Maximum relative resistivity change (%) |
| --- | --- | --- |
| Cu | 1.77 | 5.0 |
| Au | 14.8 | 1.8 |
| Ag | 15.0 | 1.8 |
| Al | 14.0 | 2.0 |

As is shown in Table 3, the relative resistivity change varies distinctively, depending on the materials of the nonferromagnetic layer. In order to elucidate the factors affecting such variation, the cross section of the multilayer was observed with a transmission type electron microscope. Consequently, remarkable epitaxial growth was observed between the nonferromagnetic layer and the Ni—Fe alloy layer, only in the case that Cu was used as the nonferromagnetic layer. The relation between the epitaxial growth and the relative resistivity change is considered as follows.

If the epitaxial growth is not induced at the interface between ferromagnetic layer and nonferromagnetic layer, the alignment of atoms at the interface becomes inconsistent, resulting in lattice defects. If crystalline defects are present, electrons are scattered there. Such scattering increases resistance. Accordingly, if there are many defects, electrical resistance generally increases with no relation to the direction of magnetization. Therefore, the resistance change due to the direction of magnetization becomes relatively smaller. Thus, lower magnetoresistive effect is observed. As is shown in Table 3, Ag, Au, Al, etc. have larger lattice mismatches (the term "lattice mismatch" is defined as the value obtained by dividing the difference in lattice parameter between nonferromagnetic layer and ferromagnetic layer, by a lattice parameter of a magnetic layer). Therefore, epitaxial growth is not induced.

On the contrary, Ni—Fe alloy and Cu are of face-centered cubic structure, and the lattice parameters thereof are different only by about 1.8%. Therefore, epitaxial growth is induced at the interface between ferromagnetic layer and nonferromagnetic layer, and defects are hardly developed in the ferromagnetic layer. If there is not scattering due to defects, it is considered that resistance change due to the direction of magnetization effectively can be observed.

It is also suggested that besides the aforementioned mechanism, lattice defects may affect local directions of magnetization at the interface, leading to epitaxial growth and less defects, which is advantageous to obtain a higher magnetoresistive effect.

As has been described above, the development of epitaxial growth at a part at least of the interface between nonferromagnetic layer and ferromagnetic layer is preferable for bringing about a high magnetoresistive effect.

EXAMPLE 6

Figure 5:
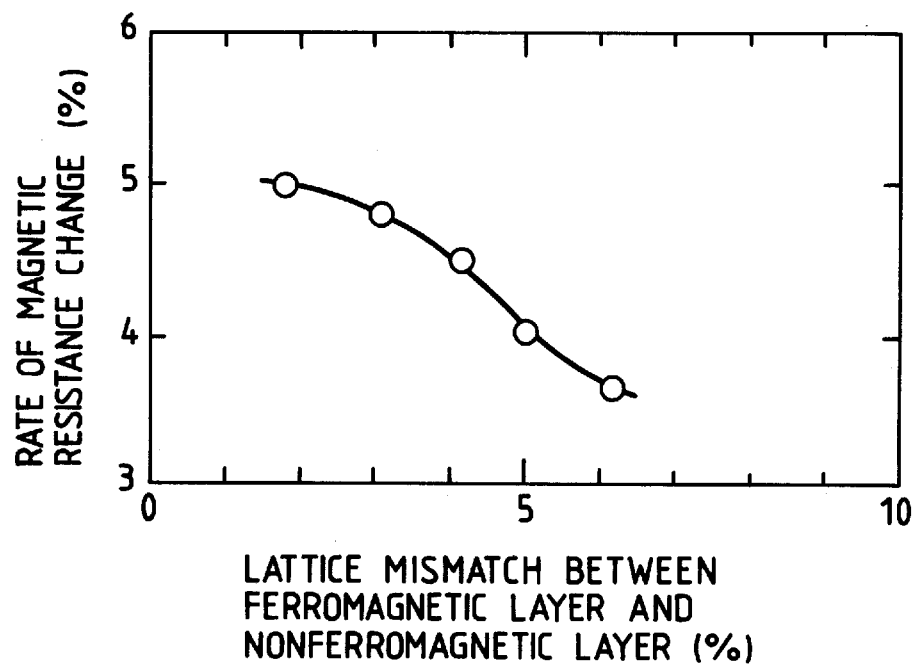
FIG. 5 represents a graph depicting the relation between the rate of magnetic resistance change and lattice mismatch.

Following the same method as in Example 1, a multilayer which showed the magnetoresistive effect was formed. There were used Co of a film thickness of 3 nm and Ni—Fe alloy of a film thickness of 3 nm, respectively, and Cu—Au alloy of a film thickness of 5 nm as nonferromagnetic layer 13, as are shown in FIG. 1. Au was added so as to change the lattice parameter of Cu. The relation between the lattice mismatch of Cu—Au alloy and Ni—Fe alloy and the relative resistivity change is shown in FIG. 5. As is shown in the figure, the relative resistivity change is larger as the lattice mismatch is smaller. In order to obtain a relative resistivity change of 4% or more, it is required that the lattice mismatch should be 5% or less. This is possibly because epitaxial growth is not induced if the lattice mismatch gets larger than 5% or more.

EXAMPLE 7

Figure 6:
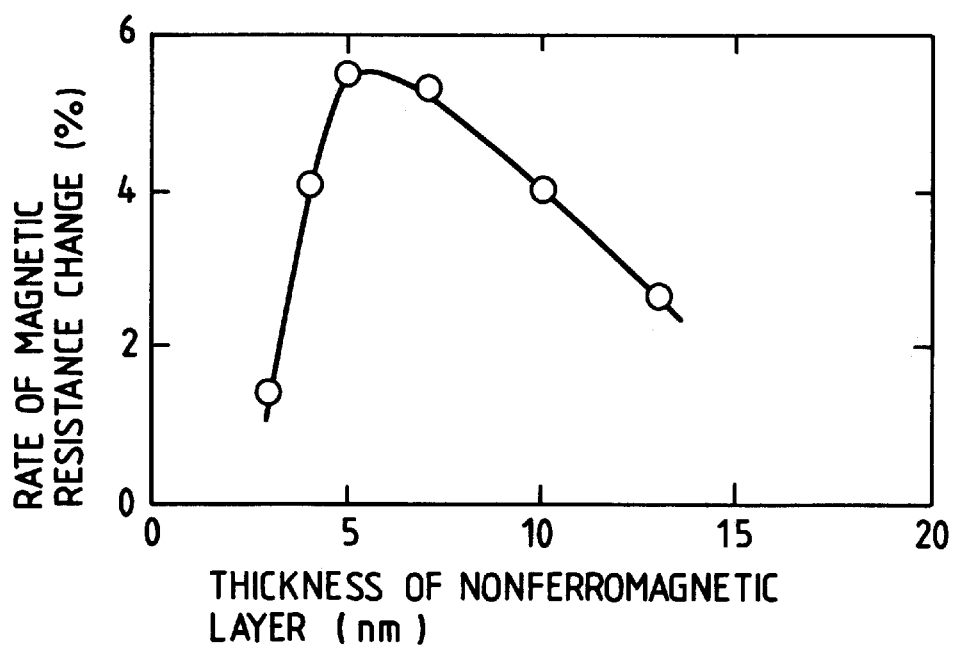
FIG. 6 is a graph depicting the relation between the rate of magnetic resistance change and the thickness of a nonferromagnetic layer.

Following the same method as in Example 1, a multilayer which showed the magnetoresistive effect was formed. There were used Co of a film thickness of 3 nm and $Co_{92}Ta_5Zr_3$ alloy of a film thickness of 3 nm as ferromagnetic layers 11 and 12, and Cu as nonferromagnetic layer 13, as are shown in FIG. 1. FIG. 6 shows the relative resistivity change when the film thickness of the nonferromagnetic layer is 5 nm. As is shown in the figure, the relative resistivity change reaches maximum when the film thickness is 5 nm. If the film thickness gets thinner than the above thickness, the relative resistivity change remarkably decreases. This is possibly because the nonferromagnetic layer becomes inconsistent so magnetic layers on and below the nonferromagnetic layer are joined together. If the film thickness gets thicker, the relative resistivity change also decreases. This is possibly because the electron spin components which pass through the nonferromagnetic layer are eliminated when the nonferromagnetic layer gets thick. Once all of the spin components are eliminated, electrical resistance does not depend on the magnetization direction of the magnetic layer any more.

As has been described above, nonferromagnetic layers of a film thickness that is too thin or too thick are not preferable. The thickness producing a relative resistivity change of 4% or more is 4 to 10 nm.

The relation between the film thickness of nonferromagnetic layer and the relative resistivity change exhibits almost the same tendency as described above, even if the types of ferromagnetic layers and nonferromagnetic layers are different from those described above.

EXAMPLE 8

Figure 7:
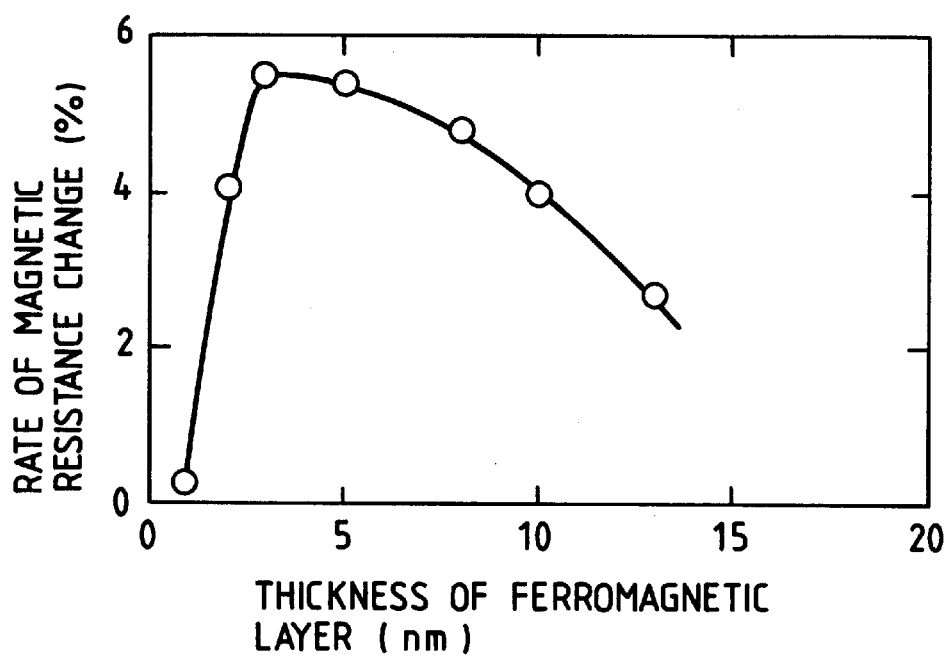
FIG. 7 is a graph depicting the relation between the rate of magnetic resistance change and the thickness of a ferromagnetic layer.

Following the same method as in Example 1, a multilayer which showed the magnetoresistive effect was formed. There were used Co and $Co_{92}Ta_5Zr_3$ alloy as ferromagnetic layers 11 and 12, respectively, and Cu of a film thickness of 5 nm as nonferromagnetic layer 13, as are shown in FIG. 1. The film thickness of ferromagnetic layer 11 was essentially equal to that of nonferromagnetic layer 13, and the film thickness of ferromagnetic layer 12 was modified. The relation between the film thickness of ferromagnetic layer 12 and the relative resistivity change is shown in FIG. 7. As is shown in the figure, the maximum relative resistivity change was obtained when the film thickness of ferromagnetic layer 12 was 3 nm. As the film thickness becomes thinner than the above thickness, the relative resistivity change rapidly decreases. This is possibly because ferromagnetic layer 12 inconsistent and nonferromagnetic layers on and below the ferromagnetic layer 12 are thus joined together. Even if the film thickness is thicker than 3 nm, the relative resistivity change decreases.

As has been described above, ferromagnetic layers of a film thickness that is too thin or too thick are not preferable. The film thickness producing a relative resistivity change of 4% or more is 2 to 10 nm.

The relation between the film thickness of the ferromagnetic layer and the relative resistivity change exhibits almost the same tendency as described above, even if the types of ferromagnetic layers and nonferromagnetic layers are different from those described above.

EXAMPLE 9

A magnetoresistive element employing the multilayer which shows the magnetoresistive effect, in accordance with the present invention, was prepared. The structure of the multilayer which shows the magnetoresistive effect is as follows; there were used Co of a film thickness of 3 nm and $Co_{92}Ta_5Zr_3$ alloy of a film thickness of 3 nm as ferromagnetic layers 11 and 12, respectively, and Cu of a film thickness of 5 nm as nonferromagnetic layer 13, as are shown in FIG. 1. The resistance change via the magnetic field of the magnetoresistive element shows the same tendency as depicted in FIG. 2. Hence, the resistance change per unit magnetic field is small near a zero magnetic field. Therefore, in accordance with the present invention, a bias field was applied on the magnetoresistive element. The strength of the bias field was 20 Oe. Consequently, a sufficient resistance change per unit field was obtained even if the strength of the magnetic field incident to the magnetoresistive element was near zero. Based on the output at the element, the direction of the magnetic field can be judged whether it is positive or negative. The same technique as is described above can be utilized for a magnetic tunneling junction element in which two or more layers of magnetic layers and insulating layers are layered on each other.

In the multilayer showing the curve of magnetic resistance as is depicted in FIG. 2, the resistance does not change unless an inversely directed and larger magnetic field is applied, if a magnetic field exceeds far above the magnetic field with the maximum resistance. In order to solve the problem, there was prepared a magnetoresistive element having a structure provided with a mechanism to apply a magnetic field of 250 Oe outwardly. As a result, a magnetoresistive element was obtained, in which the magnetic field could recover the original state even if a magnetic field exceeded far above the magnetic field with the maximum resistance.

EXAMPLE 10

Figure 8:
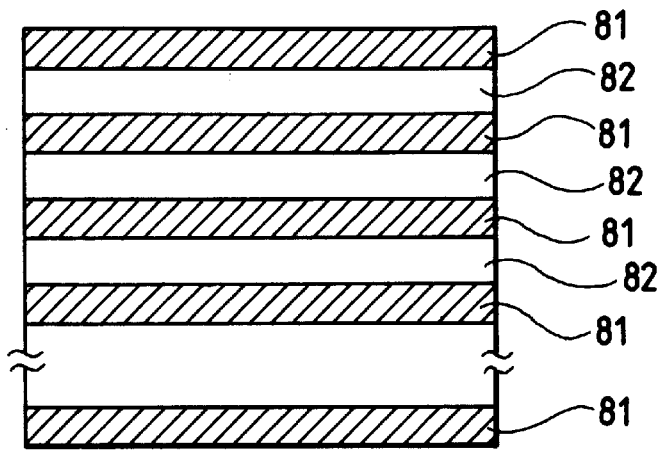
FIG. 8 is a cross sectional view of a multilayer magnetic film of the present invention.

Other examples are shown in FIG. 8. A vacuum deposition method was employed for the preparation of a multilayer which showed the magnetoresistive effect. Base pressure of the apparatus was $1/10^8$ Pa; and the deposition rate was 0.2 to 0.6 nm/s. At film deposition, a magnetic field of 250 Oe was applied in parallel to the film surface. Corning Glass 7059 manufactured by Corning Co. Ltd, was used as a substrate.

In the present example, Co (1.5 nm)/Cu (3.5 nm) was layered at 30 periods. That is, there were used Co as ferromagnetic layer 81 and Cu as nonferromagnetic layer 82. An Fe layer of a film thickness of 5 nm was formed between the multilayer which showed the magnetoresistive effect and the substrate. The Fe layer is a buffer layer to increase the magnetoresistive effect of the multilayer which showed the magnetoresistive effect. The Fe layer as a magnetic layer shows an anisotropic magnetoresistive effect, but the anisotropic magnetoresistive effect is small, so the effect only slightly affects the measurement of the magnetoresistive effect due to the multilayer structure. In view of this, the use of the Fe layer may be preferable. From the respect of completely eliminating the influence of such an effect on the measurement of the magnetoresistive effect derived from the multilayer structure, it is preferable to use a nonferromagnetic metal layer. As a nonferromagnetic buffer layer, Cu, Ti, Cr and V are effective.

Figure 9:
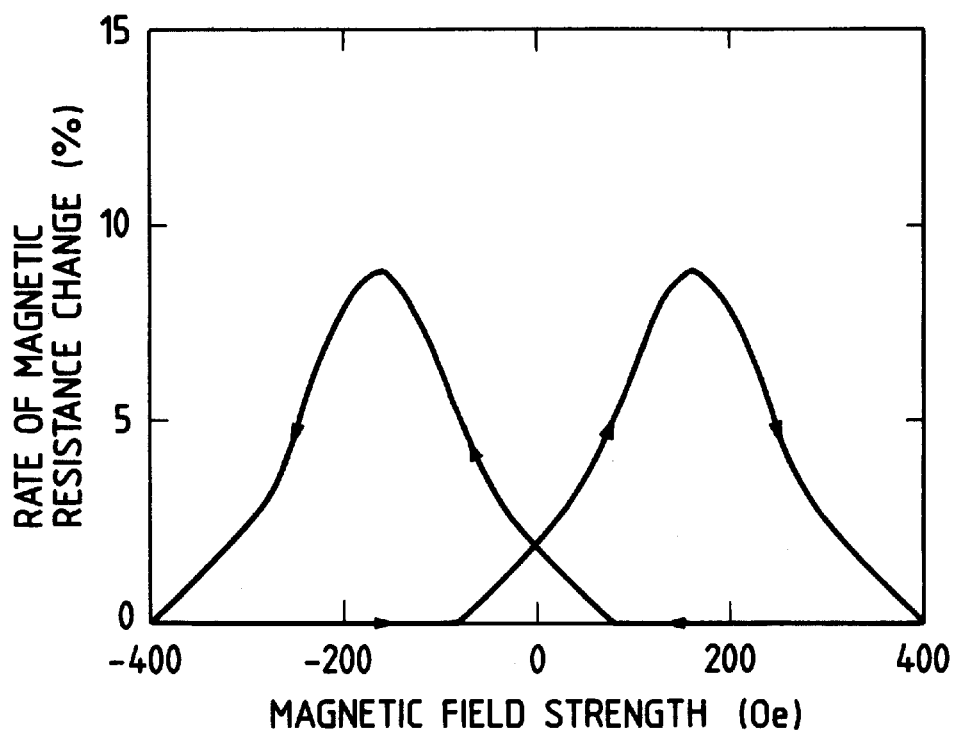
FIG. 9 represents graphs depicting the relation between the magnetic field and the rate of magnetic resistance change for a multilayer film constructed according to the teachings of the present invention.

The magnetoresistive effect was measured at room temperature when an outer magnetic field was applied in the hard axis direction of the multilayer. The results are shown in FIG. 9. The relative resistivity change was 9%. This relative resistivity change, namely 3%, is larger than that of the currently used permalloy. The relative resistivity change was 6% when no Fe buffer was used. The relative resistivity changes were 8%, 7.5%, 8% and 7% when buffer layers of Cu, Ti, Cr and V were used, in this order.

As has been described above, a metal layer composed of Fe, Cu, Ti, Cr and V, is preferably formed on a lower part of the multilayer which shows the magnetoresistive effect to be used in a magnetoresistive element (in other words, at least a part of the multilayer which shows the magnetoresistive effect in a magnetoresistive element is formed on the metal layer). Possibly because the buffer layers described above have effects such as the decrease of the stress within the multilayer which shows the magnetoresistive effect due to the contact with the multilayer and the substrate, or the increase of the crystallinity of the multilayer and the increase of crystalline alignment of the multilayer, the relative resistivity change of the multilayer is increased.

The multilayer which shows the magnetoresistive effect employing the Cu layer as a nonferromagnetic metal layer only requires a lower magnetic field to change electrical resistance, compared with the Fe/Cr multilayer film described in "Giant Magnetoresistance of (001)Fe/(001)Cr Magnetic Superlattices", Physical Review Letters, Baibich et al, supra. In order to enhance the sensitivity of magnetoresistive elements, it is very important to lower the magnetic field to be required for the change of electrical resistance. In terms of this point, it is preferable to use as a nonferromagnetic layer, materials being paramagnetic at a temperature where the magnetoresistive element is to be used, than to use antiferromagnetic layers such as Cr. As such paramagnetic materials, Mn, or Ti, V, and Cu are preferable, which are paramagnetic at ambient temperature and are of Al 2-type crystalline structure.

In the multilayer film described above, the magnetoresistive effect can be induced based on the mechanism described below. The multilayer which shows the magnetoresistive effect comprises ferromagnetic metal layers and nonferromagnetic layers, which are interchangeably layered on each other, as is shown in FIG. 8. FIG. 10 is a plan view of the multilayer film, representing the magnetization direction 101 of the ferromagnetic metal layer in layers of odd numbers and the magnetization direction 102 of the ferromagnetic metal layer in layers of even numbers (wherein the odd numbers and even numbers are individually the corresponding numbers when only ferromagnetic layers are counted).

When a higher magnetic field is firstly applied in the negative direction, the ferromagnetic metal layer is saturated magnetically. This state is shown in FIG. 10(*a*). Then, the magnetization direction 101 of the ferromagnetic metal layer in layers of odd numbers and the magnetization direction 102 of the ferromagnetic metal layer in layers of even numbers are in the same direction. When in such a state the electrons present in ferromagnetic metal layer 101 of even numbered layers pass through the nonferromagnetic metal layer 102 and are incident to another ferromagnetic layer 101, the electrons are not greatly scattered. Thus, electrical resistance is low.

When the magnetic field is set at zero starting such a state, the magnetization direction changes as is shown in FIG. 10(*b*). If a magnetic field is further applied in the positive direction, the magnetization direction becomes antiparallel at about 160 Oe, as is shown in FIG. 10(*c*). When in such a state the electrons present in ferromagnetic metal layer 101 pass through nonferromagnetic metal layer 102 and are incident to another ferromagnetic layer 101, the electrons are scattered. Thus, electrical resistance increases. When the magnetic field becomes still higher, the magnetization direction becomes parallel again and electrical resistance decreases, as is shown in FIG. 10(*e*).

As has been described insofar, a higher magnetoresistive effect can be obtained in the multilayer in which ferromagnetic metal layers and nonferromagnetic metal layers are layered on each other. Thus, a magnetoresistive element can be prepared by using the multilayer which shows the magnetoresistive effect.

The same results as in the present example can be obtained provided that the same film structure is formed, even if other methods besides vacuum deposition method are employed.

When a magnetoresistive element was formed only from the multilayer which showed the magnetoresistive effect described above, a larger output could not be obtained for a weak applied magnetic field. This can be reasonably understood based on the fact that the gradient of resistance change is small near a zero magnetic field. In order to solve the problem, an insulating layer comprising $Al_2O_3$ and having a film thickness of 50 nm was formed on the multilayer film, on which a Co—Pt permanent magnet layer of 50 nm was furthermore formed. To the permanent magnet layer was applied a magnetic field of 10 kOe in the hard axis direction of the multilayer, for magnetization. Consequently, a bias field of about 650 Oe was applied in the hard axis direction of the multilayer film.

Figure 11:
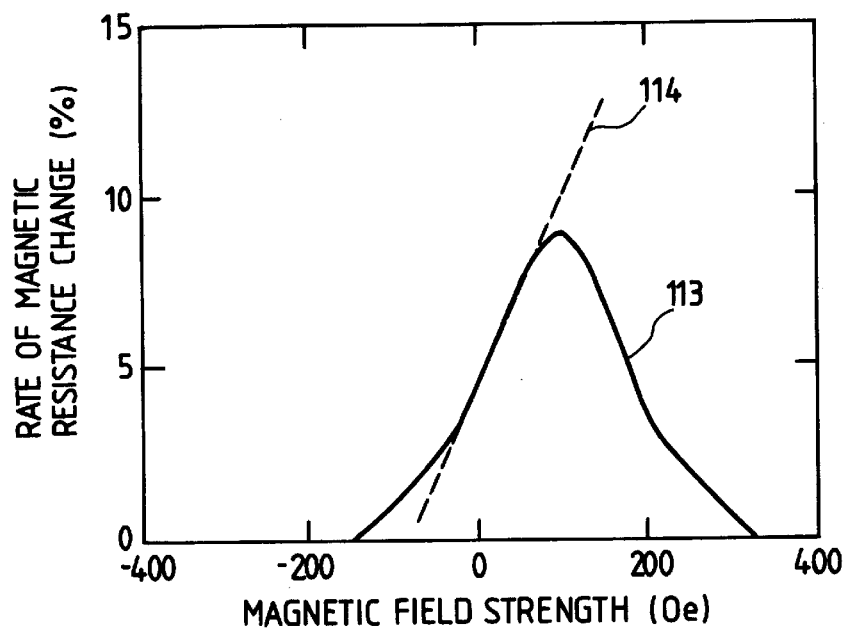
FIG. 11 is a graph depicting the relation between the magnetic field and the rate of magnetic resistance change for a multilayer film constructed according to the teachings of the present invention.

The magnetoresistive effect was measured when an outer magnetic field was applied in the hard axis direction of the multilayer film, and the results are shown in FIG. 11. In the figure, only the resistance change is shown when the magnetic field was changed from the negative to positive directions. As is shown in the figure, curve 113 of the resistance change shifts toward the direction of magnetic field, and the gradient of the resistance change gets larger near a zero magnetic field. In such a state, electrical resistance decreases when the magnetic field changes in the negative direction while electrical resistance increases when the magnetic field changes in the positive direction. Hence, the direction of the magnetic field can be readily judged whether it is positive or negative.

When a magnetoresistive element was prepared using the multilayer film applied with the bias, a larger output was obtained at a weak magnetic field. As has been described, it is necessary for a magnetoresistive element using a multilayer which shows the magnetoresistive effect, that a bias field be applied on the magnetoresistive element if the element lacks the sensitivity in the region near a zero magnetic field, so that the magnetoresistive element can be used in a field region with a higher sensitivity.

In the magnetoresistive element using the multilayer which shows the magnetoresistive effect of the present invention, each ferromagnetic metal layer is bonded together via magnetic interaction. Because nonferromagnetic metal is present between the individual ferromagnetic metal layers, the magnetic interaction described above is weaker than the exchangeable interaction. In this respect, the magnetoresistive element of the present invention is totally different from conventional magnetoresistive elements where ferromagnetic metal layers are formed with a single layer of permalloy. In terms of the application of a bias field, therefore, an essentially different situation from the conventional magnetoresistive elements using permalloy is induced.

EXAMPLE 11

It is preferable that a bias field that is as uniform as possible be applied on each ferromagnetic metal layer in the magnetoresistive element using the multilayer which shows the magnetoresistive effect, in accordance with the present invention. When a permanent magnet layer is formed through a nonmagnetic layer of 50 nm or more, as in Example 10, a weak magnetic field from the relatively uniform permanent magnet is applied on the multilayer. In this respect, the permanent magnet method is preferable as a bias applying method in the magnetoresistive element using the multilayer. However, the element in its entirety becomes thick because a thick nonferromagnetic layer should be formed between the multilayer and the permanent magnet layer. Therefore, the interval of two shields to be formed on and below the element cannot be made narrow. Thus, some problem might occur in the increase of the resolution of the magnetoresistive element.

Even if there are employed the shunt bias method, the soft film method and the exchange bias method, which applications are known in general permalloy magnetoresistive elements, a bias field can be applied.

The shunt bias method is a method comprising forming a nonmagnetic metal layer directly on a multilayer which shows the magnetoresistive effect, and generating a bias field via the induction current generated by the current which bypasses into the nonmagnetic metal. Because a nonmagnetic metal layer is formed directly on the multilayer, the method has an advantage in terms of process in that an element can be fabricated in a quite simple fashion. However, the change of electrical resistance is not generated by a magnetic field, concerning the current flowing in the nonmagnetic metal layer. Therefore, the method has a drawback in that the relative resistivity change of the element in its entirety reduces. The method also has a problem, such that a larger bias field is applied on the ferromagnetic metal layer on contact to the nonmagnetic layer, but a bias field to be applied on the ferromagnetic metal layer not in contact is relatively small.

In order to solve the defects of the shunt film method described above, a nonmagnetic insulating layer was formed on a multilayer which showed the magnetoresistive effect, and furthermore nonmagnetic metal layer was formed thereon. By making a current flow in the nonmagnetic metal layer, a bias field was generated. According to the method, a magnetic field more uniform than the magnetic field according to the shunt film method can be applied on the multilayer which shows the magnetoresistive effect.

In terms of applying a relatively uniform bias field on multilayers which show the magnetoresistive effect, the soft film method is preferable. However, the element in its entirety possibly gets thick so as to form a nonmagnetic insulating layer on the multilayer.

Further in terms of applying a relatively uniform bias field on the multilayer, the exchange bias method is as preferable as the soft bias method. Because two multilayers which show the magnetoresistive effect are used and both of the multilayers are used as elements, two-fold output may be obtained and the elements per se can be prepared as differential-type elements. However, a problem is suggested that the structure of the entire element becomes complex.

It is possible to use in combination two or more methods selected from the soft film method, the shunt bias method, the exchange bias method, the permanent magnet method, and the inductive field method with electric current.

EXAMPLE 12

There has been shown in Examples 10 and 11 the case that the magnetic field in the hard axis direction of the multilayer film is detected, but the magnetic field in the easy axis direction of the multilayer film can be detected with a higher sensitivity. However, it is preferable to define the hard axis direction of the multilayer film as the direction of detecting a magnetic field, in case that a high-frequency magnetic field is to be detected. This is because the hard axis direction has a higher permeability than the easy axis direction. The difference in angle between the hard axis direction of the multilayer film and the direction of detecting a magnetic field is preferably 10° or less.

FIG. 11 shows the slope 114 of a curve of resistance change, corresponding to sensitivity. As is shown, nearly maximum slope is obtained when the rate of resistance change is 3 to 8 Oe. When converted into the angle between the magnetization direction and the direction of detecting an outer magnetic field, this value is 30 to 70°. Hence, a bias field is preferably applied at a strength which sets the angle between the magnetization direction and the direction of detecting a magnetic field at 30 to 70°.

When the magnetic resistance change has hysteresis as is shown in FIG. 10, it is preferable to add a mechanism capable of applying a higher magnetic field on the multilayer which shows the magnetoresistive effect and initializing the magnetization state.

When a magnetoresistive element is formed using two of the multilayers which show the magnetoresistive effect, a magnetoresistive element can be obtained which has a two-fold reading output.

Even if the materials of ferromagnetic layer and nonferromagnetic layer are modified, the same results described above can be obtained provided that the magnetization process can be obtained as shown in FIG. 10. The present inventors have achieved the same results described above, by employing Co/Mn, Ni/Cu, Fe/Cu multilayer films. Among those described above, Co/Mn multilayer film in particular shows excellent properties.

EXAMPLE 13

According to the same method as in Example 10, a multilayer which showed the magnetoresistive effect was formed. There were used Co of a film thickness of 1.5 nm and Cu of a film thickness of 2 nm as ferromagnetic layer 81 and nonferromagnetic layer 82, respectively. An Fe layer of a film thickness of 5 nm was formed between the multilayer which showed magnetoresistive effect and a substrate.

Figure 12:
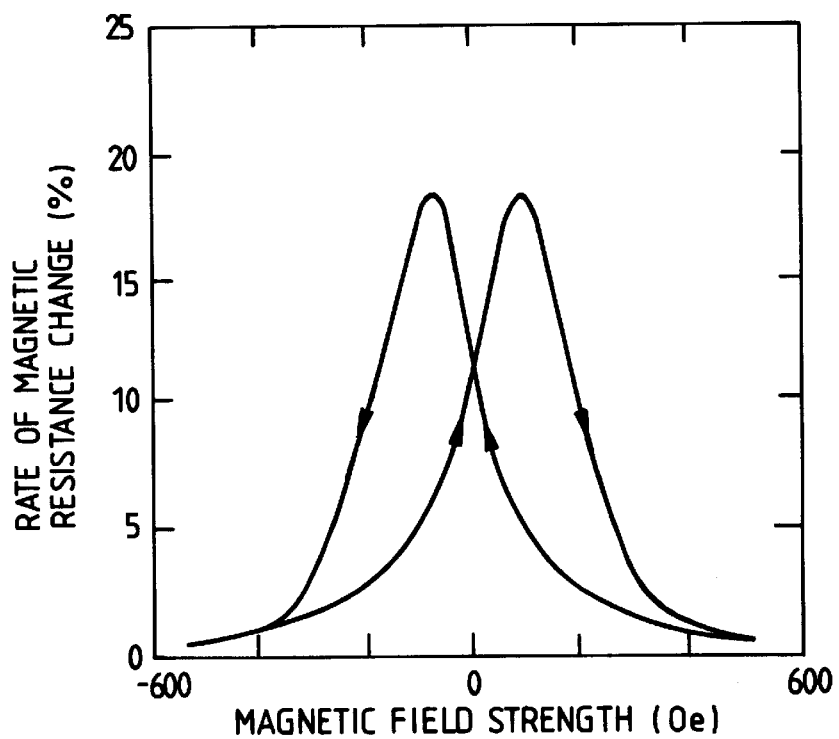
FIG. 12 represents graphs depicting the relation between the magnetic field and the rate of magnetic resistance change for a multilayer film constructed according to the teachings of the present invention.

The change of magnetoresistive effect was measured when an outer magnetic field was applied in the hard axis direction of the multilayer which showed the magnetoresistive effect. The results are shown in FIG. 12. The relative resistivity change was 18%.

Figure 13:
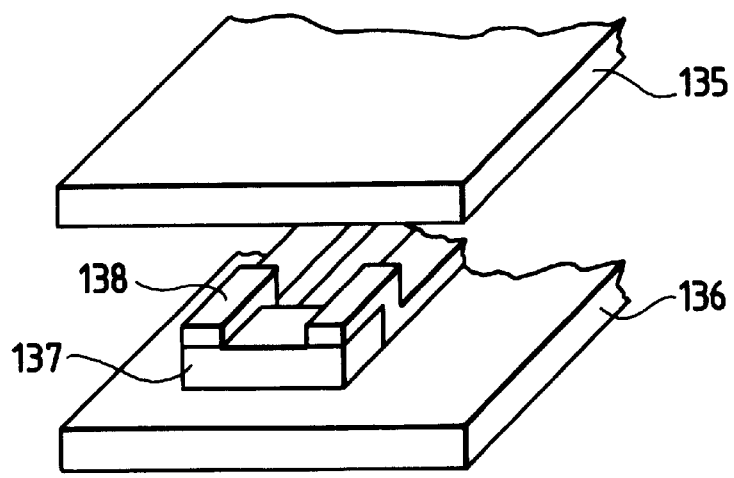
FIG. 13 is a perspective view of a magnetoresistive element of the present invention.

Using the multilayer which showed the magnetoresistive effect described above, a magnetoresistive element was prepared. The structure of the magnetoresistive element is shown in FIG. 13. As is shown in FIG. 13, the magnetoresistive element comprises shield layers 135 and 136, multilayer 137 which shows the magnetoresistive effect, and electrode 138. This magnetoresistive element is not provided with a mechanism to apply a bias field. As the shield layers 135 and 136, permalloy of a film thickness of 1 $\mu$m was used. As electrode 138, a Cu layer of a film thickness of 100 nm was used. As the gap material between the individual layers, $Al_2O_3$ was used. The film thickness of the gap layer was 100 nm.

As is shown in FIG. 12, the magnetoresistive element described above has a larger gradient of electrical resistance change near the outer magnetic field of zero. Accordingly, a mechanism to apply a bias field is not required when such a multilayer is used. If no mechanism to apply a bias field is provided, the interval of the two shield layers can be made narrow compared with the case where a mechanism to apply a bias field is present. Therefore, an advantage is obtained in that a magnetoresistive element with a higher resolution can be realized.

Figure 14:
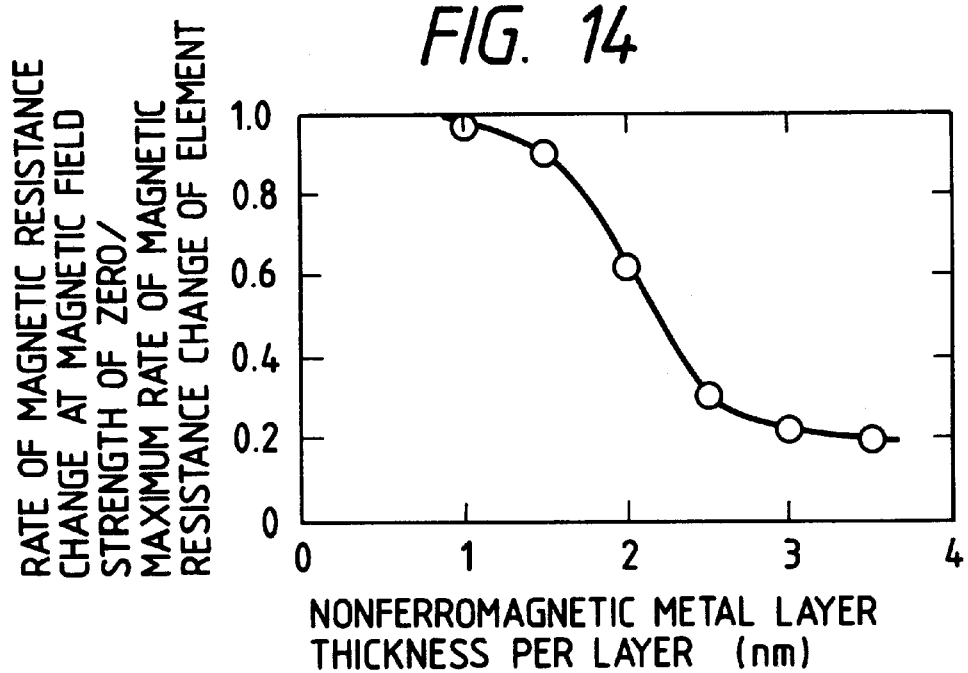
FIG. 14 is a graph depicting the relation between the rate of magnetic resistance change and the thickness of nonferromagnetic layer.

However, in order to make a larger gradient of electrical resistance change near the outer magnetic field of zero, it is required to control the film thickness per single layer of ferromagnetic metal layer. In FIG. 12, the relative resistivity change is 11% when the magnetic field is zero. The value corresponds to 0.6 times the maximum relative resistivity change (18%) of the element. It was found that when the relative resistivity change at a magnetic field of zero corresponded to 0.3 to 0.9 times the maximum relative resistivity change, a relatively larger gradient of electrical resistance change was observed even near the outer magnetic field of zero. The relation between the film thickness per single layer or nonferromagnetic metal layer and the value of (relative resistivity change at a magnetic field of zero/maximum relative resistivity change of element) is shown in FIG. 14. As is shown in the figure, the value of (relative resistivity change at a magnetic field of zero/maximum relative resistivity change of element) is 0.3 to 0.9 when the film thickness per single layer of nonferromagnetic metal layer is 1.5 to 2.5 nm. Accordingly, in order to obtain a magnetoresistive element which does not require a bias, it is preferable that the film thickness per single layer of nonferromagnetic metal layer should be 1.5 to 2.5 nm.

The present example shows the case where the magnetic field in the hard axis direction of the multilayer is detected, but the magnetic field in the easy axis direction of the multilayer can be detected as well. When detecting a high-frequency magnetic field, however, it is preferable to define the hard axis direction of the multilayer as the direction for detecting a magnetic field. This is because the hard axis direction of the multilayer which shows the magnetoresistive effect has a higher specific magnetic permeability than the easy axis direction of the multilayer. The difference in angle between the hard axis direction of the multilayer and the direction for detecting a magnetic field is preferably 10° or less.

The multilayer which shows the magnetoresistive effect is preferably in the state where the angle between the magnetization direction and the direction of detecting a magnetic field has been set at 30 to 70°.

As is shown in FIG. 12, if hysteresis occurs in the magnetic resistance change of a multilayer which shows the magnetoresistive effect, it is preferable to add a mechanism to initialize the magnetization state by applying a higher magnetic field on the multilayer.

Even if the materials of the ferromagnetic layer and nonferromagnetic layer are modified, the same results as in the present example can be obtained only if the magnetization process as is shown in FIG. 12 can be obtained. The present inventors have achieved the same results described above, concerning Co/Mn, Ni/Cu, and Fe/Cu multilayers. Among them described hereinabove, a Co/Mn multilayer in particular has showed excellent properties.

EXAMPLE 14

The multilayer which shows the magnetoresistive effect in Example 10 has different curves of magnetic resistance change when the magnetic field is higher than zero and lower than zero. Therefore, deviation might occur in the output wave form of a magnetoresistive element in which the multilayer is used as it is. Thus, in the present example, there was fabricated a magnetoresistive element employing two of the multilayers which show the magnetoresistive effect as those described in Example 2.

Between the two multilayers which showed the magnetoresistive effect, one was used after being applied a large negative magnetic field while the other such multilayer was used after being applied a larger positive magnetic field. Therefore, the one got increased electric current and the other got decreased electric current, when a weak magnetic field was applied from zero to the positive direction. The one got decreased electric current and the other got increased electric current when a weak magnetic field was applied from zero to the negative direction. When the output difference between the two multilayers which showed the magnetoresistive effect was measured, the output was then increased by two fold compared with the case that only one such multilayer was used.

As is shown in FIG. 12, the forms of the two curves of magnetic resistance change, on the right and left sides, are symmetric based on the zero magnetic field. On measuring the output difference between the two multilayer which show the magnetoresistive effect, the outputs are therefore equal when the amount of the change of magnetic field strength remains the same even if the magnetic field has different directions, as is described above. That is, no deviation may occur in the output wave form of the magnetoresistive element.

As has been described above, by using two of the multilayers which showed the magnetoresistive effect, a magnetoresistive element outputting the difference of the outputs between the two was prepared. Consequently, there could be obtained a magnetoresistive element, wherein the output was enhanced by almost two fold, compared with the case where only one such multilayer which showed the magnetoresistive effect was used and no deviation of regenerated wave form was observed.

EXAMPLE 15

Following the same method as in Example 10, a multilayer which showed the magnetoresistive effect was formed. There were used Co of a film thickness of 1.5 nm, and various metals of a film thickness of 2 nm, as ferromagnetic layer 81 and nonferromagnetic layer 82, respectively, as is shown in FIG. 8. The relative resistivity change due to the materials of nonferromagnetic metal layer 82 is shown in Table 4.

TABLE 4

| NonFerromagnetic layer | Lattice mismatch between nonferromagnetic layer and ferromagnetic layer (%) | Maximum relative resistivity change (%) |
| --- | --- | --- |
| Cu | 1.89 | 18.0 |
| Au | 14.9 | 3.0 |
| Ag | 15.2 | 2.6 |
| Al | 14.1 | 2.2 |
| Pt | 10.6 | 3.6 |
| Rh | 7.19 | 4.2 |

As is shown in the table, the relative resistivity change varies distinctively, depending on the materials of the nonferromagnetic metal layer. In order to elucidate the factors inducing such variation, the cross section of the multilayers was observed with a transmission type electron microscope. Consequently, remarkable epitaxial growth was observed between the nonferromagnetic layer and Co layer, only in the case that Cu was used as nonferromagnetic layer. (It was found that Co is of face-centered cubic structure because the Co layer is thin). The relation between the epitaxial growth and the relative resistivity change is considered as follows.

If epitaxial growth is not induced at the interface between the ferromagnetic metal layer and the nonferromagnetic metal layer, the alignment of atoms becomes inconsistent at the interface, resulting in lattice defects. If crystalline defects are present, electrons are scattered there. Such scattering inevitably increases resistance. Accordingly, electrical resistance increases with no relation to the direction of magnetization, if there are many defects. Therefore, the resistance change due to the direction of magnetization becomes relatively smaller. Thus, a smaller magnetoresistive effect is observed. As is shown in Table 4, Ag, Au, Al, Pt, Rh, etc. have larger lattice mismatches (the term "lattice mismatch" is defined as the value obtained by dividing the difference in lattice parameter between the nonferromagnetic layer and the ferromagnetic layer, by a lattice parameter of a magnetic layer). Thus, epitaxial growth is not induced.

On the other hand, the difference in lattice parameter between Co and Cu is about 1.9%. Therefore, epitaxial growth occurs in the interface between the ferromagnetic metal layer and the nonferromagnetic layer, leading to the difficulty of the development of defects in the ferromagnetic metal layer. In case that no scattering due to defects is present, the resistance change due to the magnetization direction can be observed efficiently.

Besides the mechanism described above, the local direction of magnetization at the interface may possibly be affected by lattice defects, resulting in epitaxial growth and few defects, which is advantageous for producing a high magnetoresistive effect.

As has been described above, it is preferable to induce epitaxial growth at a part at least of the interface between the nonferromagnetic metal layer and the ferromagnetic layer, in order to obtain a high magnetoresistive effect.

The improved properties due to the epitaxial growth described hereinabove are observed in both of the magnetoresistive element having a mechanism to apply a bias field as is shown in Example 10 and a magnetoresistive element without a mechanism to apply a bias field as is shown in Example 11.

EXAMPLE 16

Figure 15:
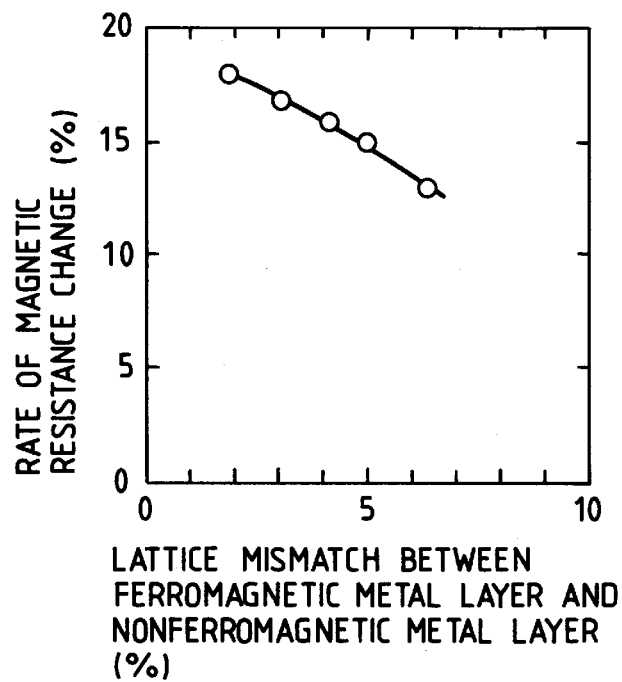
FIG. 15 is a graph depicting the relation between the rate of magnetic resistance change and lattice mismatch.

According to the same method as in Example 10, a multilayer which showed the magnetoresistive effect was formed. There were used Co of a film thickness of 1.5 nm and Cu—Au alloy of a film thickness of 2 nm as ferromagnetic layer 81 and nonferromagnetic layer 82, in FIG. 8, respectively. Au was added, in order to change the lattice parameter of Cu. The relation between the lattice mismatch of the Cu—Au alloy and Co and the relative resistivity change is shown in FIG. 15. As is shown in the figure, the relative resistivity change increases as the lattice mismatch decreases. In order to obtain a relative resistivity change of 15% or more, it is required that the lattice mismatch be 5% or less. This is possibly because epitaxial growth is not greatly induced if the degree of lattice mismatch exceeds 5% or more.

The improvement of properties due to the epitaxial growth described above can be observed for a magnetoresistive element having a mechanism to apply a bias field as is shown in Example 10 and a magnetoresistive element not having a mechanism to apply a bias field as is shown in Example 11.

EXAMPLE 17

According to the same method as in Example 10, a multilayer which showed the magnetoresistive effect was formed. There were used Co of a film thickness of 1.5 nm and Cu of a film thickness of 2 nm as ferromagnetic layer 81 and nonferromagnetic layer 82 in FIG. 8, respectively. By changing the substrate temperature to prepare a multilayer which showed the magnetoresistive effect, the amount of the mutual diffusion between individual layers was modified. The amount of mutual diffusion was calculated based on the change of saturated magnetic flux density of the entire multilayer which showed the magnetoresistive effect.

Figure 16:
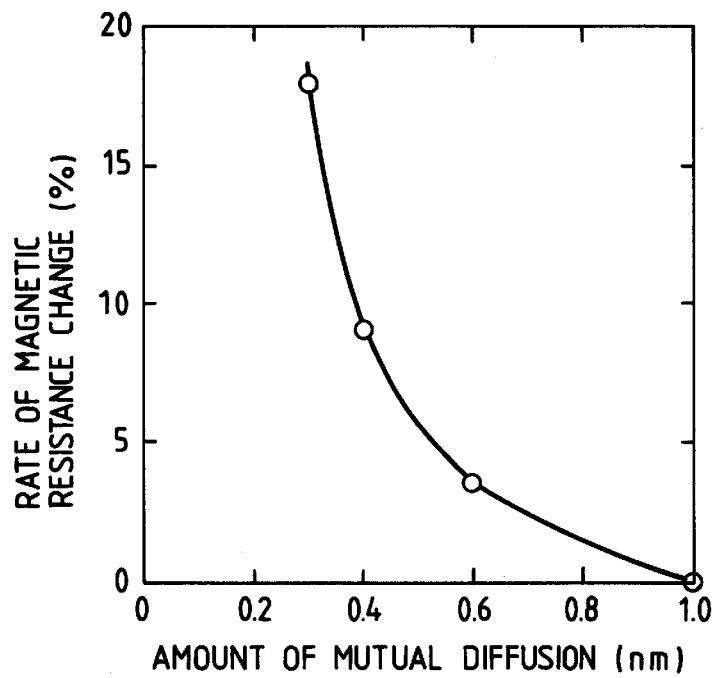
FIG. 16 is a graph depicting the relation between the rate of the magnetic resistance change and the amount of mutual diffusion.
Figure 17:
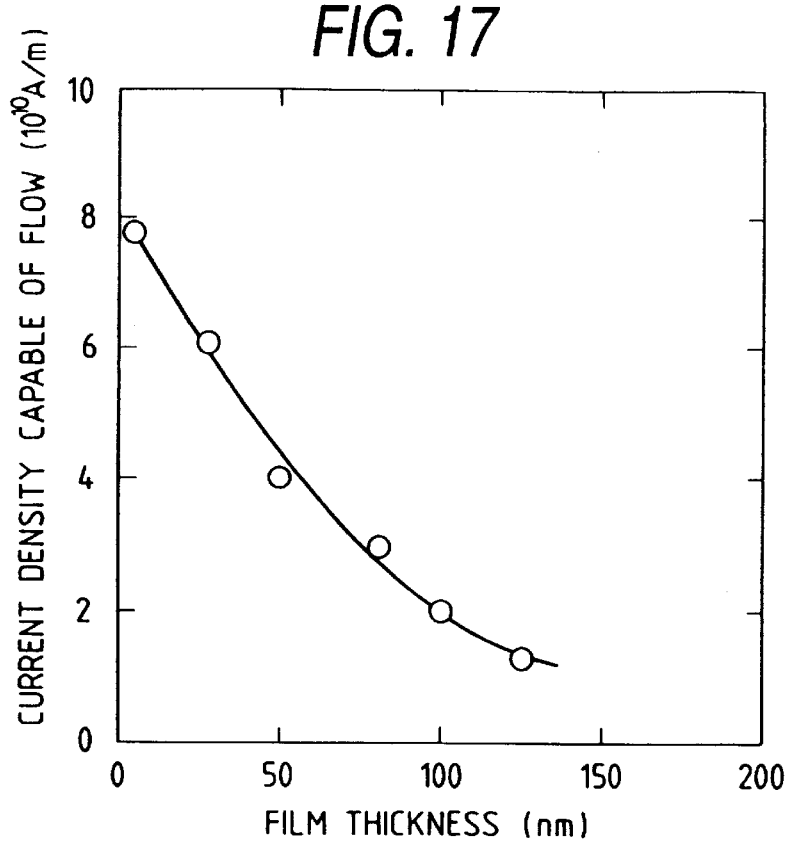
FIG. 17 is a graph depicting the relation between the film thickness of a multilayer magnetic film and a current density capable of flow.

The relation between the amount of the mutual diffusion and the maximum relative resistivity change is shown in FIG. 16. As is shown in the figure, the maximum relative resistivity change is rapidly decreased when the amount of mutual diffusion is increased. Therefore, the amount of mutual diffusion is preferably 0.3 nm or less.

EXAMPLE 18

According to the same method as in Example 10, a multilayer which showed the magnetoresistive effect was formed. There were used Co of a film thickness of 1.5 nm and Cu of a film thickness of 1 nm as ferromagnetic layer 81 and nonferromagnetic layer 82, of FIG. 8, respectively.

When a sense current is made to flow in a magnetoresistive element using the multilayer described above, the output of the magnetoresistive element increases, depending on the intensity of the sense current. When a current with a certain current density or more is made to flow, the element is broken down. This is because the magnetoresistive element is heated with Joule heat so that the induction of electromigration becomes easy.

FIG. 10 shows the relation between the film thickness of the multilayer and the maximum current density which can flow in the element. As is shown in the figure, the current density flow increases as the film thickness of the multilayer decreases. This is because the heat of the multilayer which shows the magnetoresistive effect readily escapes as the film thickness gets thinner. In order to make a current of $2 \times 10^{10}$ A/m or more to flow, it is required to prepare a film thickness of 100 nm or less. In order to make a current of $4 \times 10^{10}$ A/m or more to flow, it is required to prepare a film thickness of 50 nm or less.

It has been demonstrated that five ferromagnetic layers at least are necessary in order to obtain a magnetoresistive effect satisfactory for an element. Therefore, it is preferable that the film thickness of the multilayer which shows magnetoresistive effect be 11.5 nm or more.

The relation between the film thickness of the multilayer and the current density shows the same tendency as is described above, even if the types of the ferromagnetic and nonferromagnetic layers are different from those described above.

EXAMPLE 19

Figure 18A:
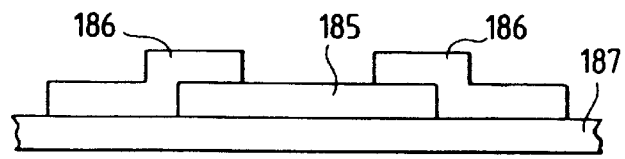
FIG. 18 represents cross sectional views of a magnetoresistive element of the present invention.
Figure 18B:
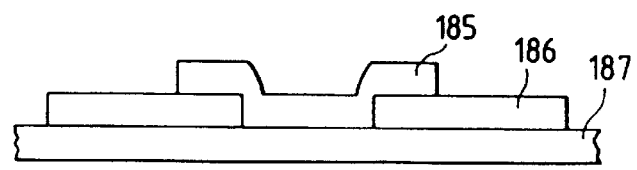
Figure 18C:
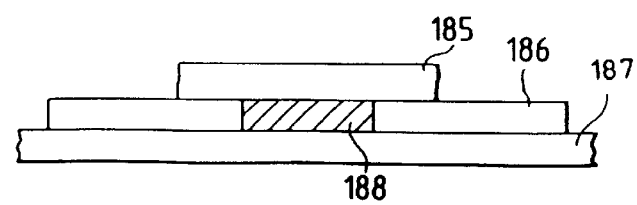

There were prepared three types of magnetoresistive elements of the cross sectional structure shown in FIG. 18. The structure of the multilayer which shows the magnetoresistive effect is the same as in FIG. 8. There were used Co of a film thickness of 1.5 nm and Cu of a film thickness of 2 nm, as ferromagnetic layer 81 and nonferromagnetic layer 82, respectively. The number of layers is 15 periods.

Each element comprises multilayer 185 which shows the magnetoresistive effect, electrode 186 and substrate 187. The element (c) has an insulating body 188. The maximum relative resistivity change at the individual elements were (a) 12%, (b) 13%, and (c) 15%. This is possibly because the flow mode of current in each element is different, that the maximum relative resistivity change varies depending on each element. That is, the current flows in a relatively upper part of the multilayer 185 which shows the magnetoresistive effect in the structure (a), while the current flows in the entire multilayer 185 which shows the magnetoresistive effect in the structure (b) and the current flows in a relatively bottom part of the multilayer 185 which shows the magnetoresistive effect in the structure (c). The periodic structure of the multilayer 185 is relatively complete in a lower part of the multilayer, and such periodic structure is easily disordered as it is located in a more upper part. So as to obtain a higher magnetoresistive effect, therefore, it is preferable to have the structure where electric current flows in a lower part of the multilayer.

In the structures (b) and (c) of FIG. 18, at least a part of the multilayer which shows the magnetoresistive effect is formed on the metal layer. In order to prepare a structure where electric current flows in a lower part of the multilayer, it is relatively easy to prepare an element comprising forming at least a part of the multilayer which shows the magnetoresistive effect on the metal layer. However, the structure (a) is advantageous in that it is simpler than the structures (b) and (c). Therefore, the structure (a) is preferable in terms of processing.

The width of the magnetic-field detecting region of magnetoresistive element is easily defined with the interval of electrodes 186 in terms of processing, preferably.

EXAMPLE 20

Figure 19:
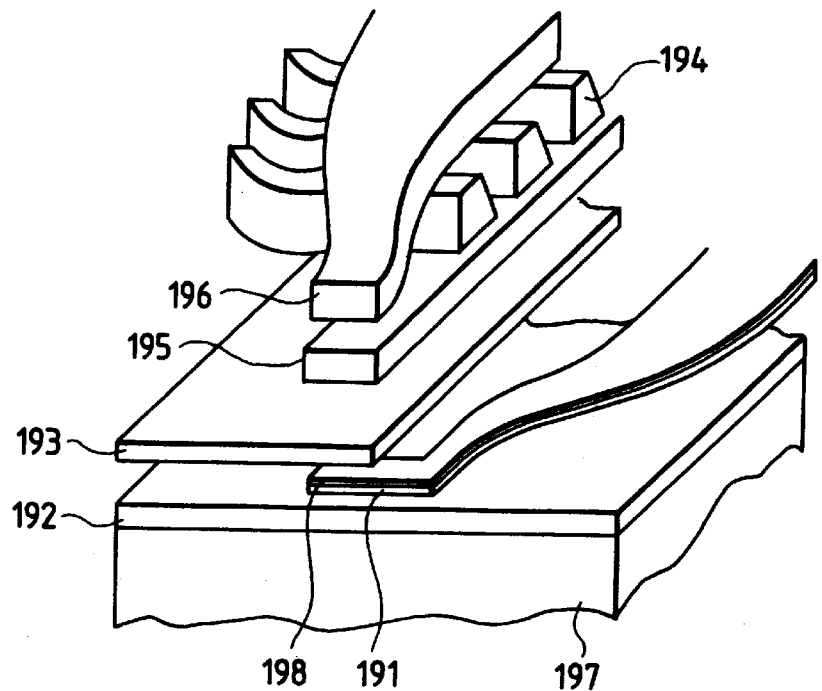
FIG. 19 is a perspective view of a magnetic head of the present invention.

Using the magnetoresistive element of the present invention, a magnetic head was prepared. The structure of the magnetic head is shown hereinbelow. FIG. 19 is a perspective view of a cross sectional part of a reading/writing separate-type magnetic head. The portion interposing the magnetoresistive element 191, in which a multilayer which shows the magnetoresistive effect is used, between shield layers 192 and 193, works as a writing head; and the portion of two writing magnetic poles 195 and 196 interposing coil 194 therewith works as a writing head. The magnetoresistive element 191 comprises the multilayers described in the above Example. In order to apply a bias field, conductor layer 198 comprising Nb was formed on the multilayer which showed the magnetoresistive effect. The method for preparing this head is shown hereinbelow.

A sintered body containing $Al_2O_3 \cdot TiC$ as a principal component was used as substrate 197 for a slider. Ni—Fe alloy, which was formed by a sputtering method, was used in the shield layers and the writing magnetic poles. The film thickness of each magnetic film was as follows. The top and bottom shield layers 192 and 193 had a film thickness of 1.0 $\mu$m; the film thickness of the writing magnetic poles 195 and 196 was 3.0 $\mu$m, and the film thickness of the multilayers which showed the magnetoresistive effect in its entirety was 100 $\mu$m. As the gap material between the individual layers, $Al_2O_3$ formed by sputtering was used. The film thickness of the gap layers was 0.2 $\mu$m between the shield layer and the magnetoresistive element, while the film thickness thereof between the writing magnetic poles was 0.4 $\mu$m. The interval between the reading head and the writing head was about 4 $\mu$m, and the gap was also formed with $Al_2O_3$. Cu of a film thickness of 3 $\mu$m was used as coil 194.

When reading/writing was effected with the magnetic head in the structure described above, a higher reading output was obtained. This is possibly because the multilayer which shows a higher magnetoresistive effect is used as the magnetic head of the present invention, and because an adequate bias field is applied.

It is required for the magnetic head to have excellent high-frequency properties. Therefore, the hard axis direction of the multilayer is preferably vertical to the surface of a magnetic writing medium.

In the above example, there is shown the case where the shunt bias method is adopted as the bias method. However, the same effect can be obtained even if other bias methods such as the current bias method, the permanent magnet method, the soft film method, the exchange bias method, etc., are used.

When the magnetoresistive element described in Examples 12 and 13 is used, a magnetic head showing a higher output can be obtained without requiring the bias applying method.

When an element for writing is formed near a part of a substrate in case that a magnetic head has both of a writing potency and a reading potency, a larger difference in level is formed because of the the formation of coil, magnetic poles, etc. at an upper part of the element for writing. If a multilayer which shows the magnetoresistive effect is formed thereon, the multilayer structure is disturbed due to the influence of the difference in grade, unfavorably. On the contrary, if a magnetic element for writing is formed near a part of a substrate as is shown in FIG. 19, the magnetoresistive element is formed at a part with a relatively small difference in level, leading to the difficulty of the occurrence of the disturbance of the multilayer structure. This is an essentially different phenomenon from the magnetoresistive element using a permalloy single layer film.

In view of the above, it is preferable to form a magnetoresistive element for writing near a part of a substrate, in case that a magnetic head has both of a writing potency and a reading potency.

Further, a magnetoresistive element can be formed at a part with less difference in level, when an element for writing and a magnetoresistive element for regeneration are formed at different places on an identical single substrate.

By applying the magnetic head to a magnetic storage apparatus, a high-potential magnetic storage apparatus can be obtained as well.

EXAMPLE 21

Using the magnetoresistive element of the present invention, a magnetic head was prepared. The structure of the magnetic head is almost the same as is shown in FIG. 19.

Magnetoresistive element 191 comprises the multilayer which shows the magnetoresistive effect as is described in Example 13. That is, there were used Co of a film thickness of 1.5 nm and Cu of a film thickness of 2 nm, as the ferromagnetic layer and the nonferromagnetic layer, respectively. An Fe layer of a film thickness of 5 nm was formed between the multilayer and a substrate. The method for preparing a head is almost the same as in Example 20. However, no conductor layer for applying a bias field is arranged.

That is, a sintered body containing $Al_2O_3 \cdot TiC$ as principal component was used as substrate 197 for the slider. The Ni—Fe alloy prepared by a sputtering method was used for the shield layers and the writing magnetic poles. The film thickness of each magnetic film is as follows. The top and bottom shield layers 192 and 193 had a film thickness of 1.0 $\mu$m; the writing magnetic poles 195 and 196 had a film thickness of 3.0 $\mu$m; and the film thickness of the entire multilayer which showed the magnetoresistive effect was 100 nm. As the gap material between individual layers, $Al_2O_3$ formed by sputtering was used. The film thickness of the gap layers was 0.15 $\mu$m between the shield layer and the magnetoresistive element, while the film thickness thereof between the writing magnetic poles was 0.4 $\mu$m. The interval between the reading head and the writing head was about 4 $\mu$m, and the gap was also formed with $Al_2O_3$. Cu of a film thickness of 3 $\mu$m was used as coil 194.

When reading/writing was effected with the magnetic head in the structure described above, a higher reading output was obtained. This is possibly because the multilayer which shows a higher magnetoresistive effect is used as the magnetic head of the present invention, and because the amount of the electrical resistance change of the multilayer per unit magnetic field near a zero magnetic field is large.

It is required for the magnetic head to have excellent high-frequency properties. Therefore, the hard axis direction of the multilayer is preferably vertical to the surface of a magnetic writing medium. In case that such magnetic head has both reading and writing potencies, the magnetoresistive element for writing is preferably arranged at a portion near the substrate.

By using the aforementioned magnetic head in magnetic storage apparatus, a high-potential magnetic storage apparatus can be obtained.

EXAMPLE 22

One example of the present invention will now be explained with reference to FIGS. 20 and 21. The present example relates to the strength (absolute value) of a bias field. The strength of a bias field is smaller than the strength of the magnetic field with maximum resistance change shown in FIG. 2. If not so, the range of the working magnetic field is included within the hysteresis range of resistance change. In such case, the response becomes non-linear.

Figure 20:
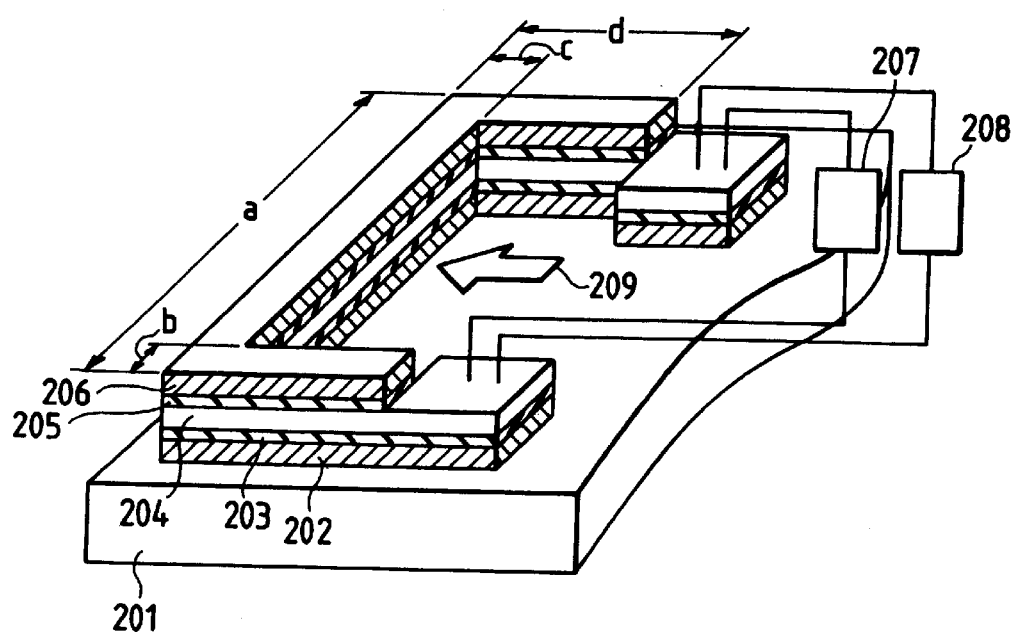
FIG. 20 is a perspective view of a magnetoresistive element of the present invention.
Figure 21:
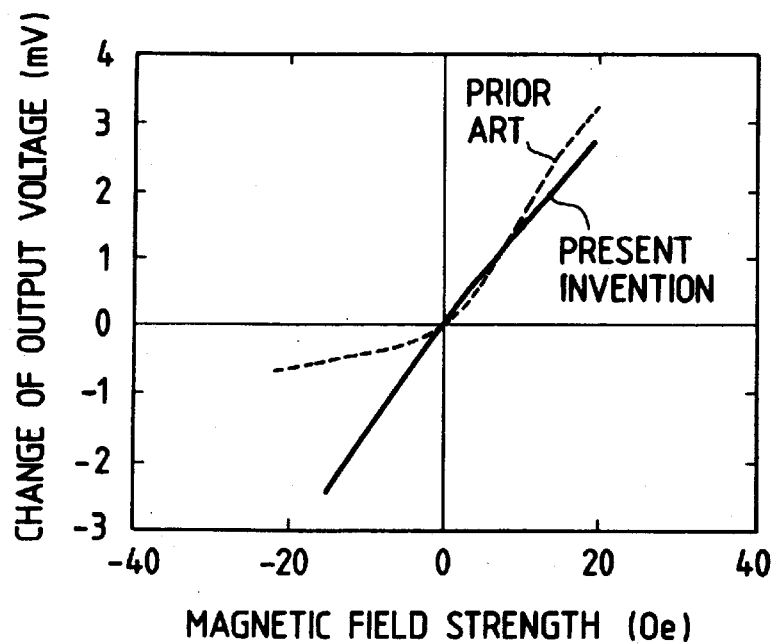
FIG. 21 is a graph depicting the relation between the magnetic field and the change of output voltage.

As is shown in FIG. 20, Co—Pt alloy film (permanent magnet film) 202 with a high coercive force and of a 200-nm thickness, an SiO insulating film 203 of a thickness of 100 nm, a layered magnetic thin film 204, an SiO insulating film 205 of a thickness of 100 nm, and Co—Pt alloy film 206 with a high coercive force and of a thickness of 200 nm, were continuously formed on ceramic substrate 201. A magnetic-field detecting part in the form shown in FIG. 20 was then fabricated by photolithography. In the figure, the dimensions shown as "a" to "d" are a=100 $\mu$m, b=5 $\mu$m, c=5 $\mu$m and d=15 $\mu$m. The layered magnetic thin film was produced by layering 15 periods of a cycle of [Co/Cu/FeNi/Cu], wherein the Co layer was of a thickness of 3 nm, the FeNi alloy layer was of a thickness of 3 nm, and the Cu layer was of a thickness of 8 nm. The thickness of the film was 330 nm. To the magnetic-field detecting part were connected constant source 207 and voltage detecting unit 208.

A magnetic field of 5 kOe was applied in the direction depicted with arrow 209 in FIG. 20, to initialize the magnetic-field detecting part. The strength of the magnetic field is larger than that required for the in initialization of layered magnetic thin film 204 and larger than the coercive force of permanent magnet films 202 and 206. Consequently, the direction of a bias field from the permanent magnet films 202 and 206 arranged on and below the layered magnetic film 204 after magnetization is inverse to the magnetization direction of the permanent magnet film. The saturation magnetic flux density and film thickness of the permanent magnet film are adjusted so that the central value of the bias field might be located near the center of the linear region of the resistance change.

Examination was effected concerning the relation between the magnetic field applied on the magnetic-field detecting part and the output voltage change. The results are shown in FIG. 21. The current flowing in the magnetic-field detecting part is 20 mA and the direction to apply a magnetic field is parallel to the arrow 209. The inverse direction to the arrow 209 is defined as positive. In FIG. 21, the properties of the magnetic-field detecting unit of the present example are shown in solid line. For comparison, there are shown in dotted line the properties of a magnetic-field detecting unit in a structure wherein Co—Pt alloy film with a high coercive force arranged on both of the top and bottom sides of the layered magnetic thin film is removed from the magnetic-field detecting unit in the structure in accordance with the present example. As is apparently shown in the figure, the magnetic-field detecting unit arranged with a permanent magnet film (Co—Pt alloy thin film) in accordance with the present invention can produce a response with better linearity. The deviation from the straight line normalized with the output voltage change in the magnetic-field region of ±10 kOe can be lowered down to 5% or less, in case that the permanent magnet film of the present invention is arranged. On the contrary, the deviation is 25% or more in case that no permanent magnet film is arranged. That is, the linearity is improved by 5 fold. A larger output magnetic field change of ±1.5 mV has been obtained via the change of magnetic field of ±10 Oe.

EXAMPLE 23

One example of the present invention will now be explained with reference to FIG. 22. As is shown in the figure, the magnetic-field detecting part of the magnetic-field detecting unit of the present invention has a structure wherein the Co—Pt alloy film with a high coercive force and the $SiO_2$ insulating film, arranged on the extreme bottom, are removed from the structure in accordance with the present example. A layered magnetic thin film 204, an SiO insulating film 205 of a thickness of 100 nm and a Co—Pt alloy thin film 206 with a high coercive force and of a thickness of 500 nm, were continuously formed on ceramic substrate 201. Subsequently, a magnetic-field detecting part in the form shown in FIG. 22 was formed by photolithography. The structure of the magnetic-field detecting part and the layer structure of the layered magnetic thin film are the same as in Example 22. The dimensions shown as "a" to "d" were a=100 µm, b=5 µm, c=5 µm and d=15 µm. The layered magnetic thin film was produced by layering 15 periods of a cycle of [Co/Cu/FeNi/Cu], wherein the Co layer was of a thickness of 3 nm, the Fe—Ni alloy layer was of a thickness of 3 nm, and the Cu layer was of a thickness of 8 nm. The thickness of the film was 330 nm. To the magnetic-field detecting part were connected constant source 207 and voltage detecting unit 208.

Figure 22:
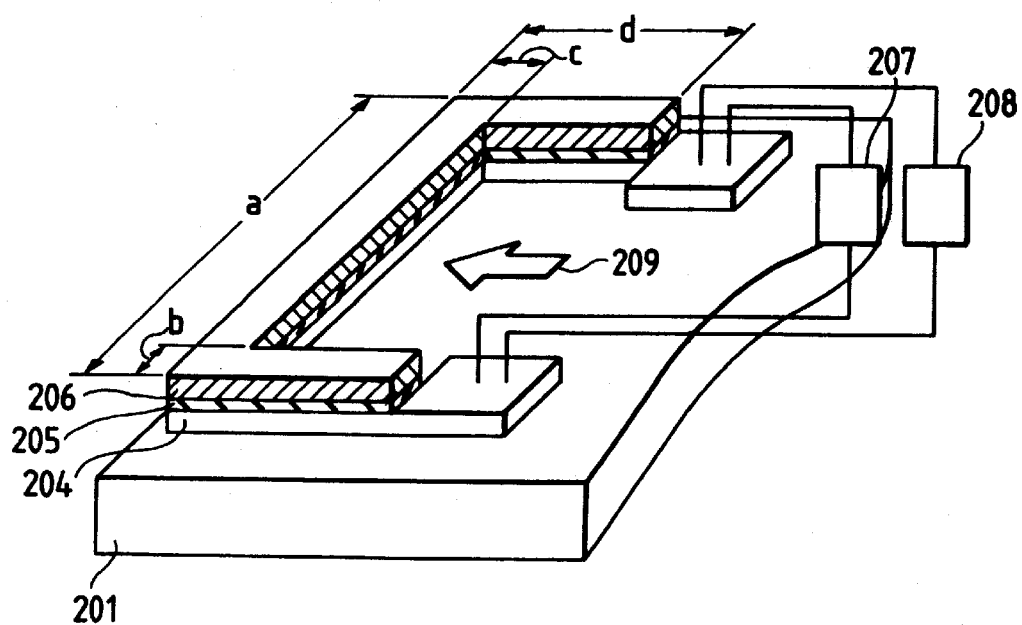
FIG. 22 is a perspective view of a magnetoresistive element of the present invention.

A magnetic field of 5 kOe was applied in the direction depicted with arrow 209 in FIG. 22, to initialize the magnetic-field detecting part. Subsequently, the relation between the magnetic field strength applied on the magnetic-field detecting part and the change of output voltage was examined. Consequently, the response is improved in terms of linearity by 5 fold, compared with that of the structure where the alloy film with a high coercive force is removed.

The magnetic-field detecting part of the present example causes non-uniform direct current bias fields to be applied on the layered magnetic thin film, compared with the structure of Example 22 wherein a magnetic thin film with a coercive force arranged on both of the top and bottom sides of the layered magnetic thin film. Therefore, the difference between the magnetic region where the resistance change loses hysteresis and the direct current bias magnetic field, gets effectively small. Thus, a problem is suggested such that the region of a measurable magnetic field gets narrow. However, an advantage is remarked that a magnetic-field detecting part with uniform properties can be produced with good reproducibility, as the layered magnetic thin film can be directly formed on a substantially plane substrate.

According to the present example, the linearity of the response to a magnetic field can be improved by five-fold, in case of the application to a magnetic-field detecting unit of a layered magnetic thin film wherein at least two types of ferromagnetic layers and at least one nonferromagnetic layer are layered and which has a larger magnetic resistance change, whereby a layered magnetic thin film with a larger magnetic resistance change can be applied to a magnetic-field detecting unit suitable for the detection of a weak magnetic field such as a magnetic field leak, etc. from a magnetic domain which is recorded on a magnetic writing medium. According to the present invention, a magnetic thin film with a high coercive force is used as a means for applying a direct current bias field on a layered magnetic thin film, so a magnetic-field detecting part can be easily prepared in small scale.

By applying a bias field on a magnetoresistive element using a multilayer which shows the magnetoresistive effect due to the multilayer structure where ferromagnetic metal layers and nonferromagnetic metal layers are layered on each other, as has been described above, a magnetoresistive element with a high sensitivity can be obtained which enables the judgment of the direction of an outer magnetic field, whether it is positive or negative. As a method for applying a bias field, there can be used one method or two or more methods in combination, selected from the shunt bias method, the inductive field method with current, the permanent magnet film method, the soft film method, and the exchange bias method. By limiting the film thickness of the nonferromagnetic layer, the multilayer film can be used as a magnetic field sensor without any bias field. By setting the angle between the easy axis direction of the multilayer film in the state where a bias field is not applied and the direction for detecting an outer magnetic field at a right angle, a magnetoresistive element excellent in a high-frequency property can be obtained. By setting the angle between the easy axis direction of the multilayer film in the state where a bias field is not applied and the direction for detecting an outer magnetic field at 30 to 70°, a magnetoresistive element excellent in high-frequency property can be obtained. When there is used the multilayer film where epitaxial growth occurs, at a part at least of the interface between a ferromagnetic layer and a nonferromagnetic layer, a magnetoresistive element with a high sensitivity can be obtained. By making the difference in lattice parameter between at least a part of the ferromagnetic metal layer and at least a part of the nonferromagnetic metal layer to 5% or less, the epitaxial growth described above can be easily generated. Furthermore, by preparing the multilayer film having the magnetoresistive effect at a film thickness of 11.5 to 100 nm, there can be obtained a magnetoresistive element which hardly generates electromigration and can make a high sense current flow. By using the magnetoresistive element, a magnetic head with a high sensitivity can be obtained. By using the magnetic head in a magnetic storage apparatus, a magnetic storage apparatus with a high potential can be obtained.

What is claimed is:

1. A magnetoresistive element, comprising a multilayer film having ferromagnetic layers and nonferromagnetic layers layered on each other, wherein a nonferromagnetic layer is formed on the multilayer film, a permanent magnet layer is formed on the nonferromagnetic layer, on the multilayer film, and a bias field generated by said permanent magnet layer is applied to the multilayer film.

2. The magnetoresistive element claimed in claim 1, wherein the absolute value of the bias field to be applied to the multilayer film is smaller than the value of a magnetic field strength of the multilayer film with maximum electric resistance and the direction of said bias field is inverse to an average direction of magnetization of the permanent magnet layer.

3. The magnetoresistive element claimed in claim 1, wherein the aforementioned ferromagnetic layers contain a first layer comprising Ni or Ni alloy and a second layer different from the first layer in terms of at least one magnetic property selected from coercive force and anisotropy magnetic field.

4. The magnetoresistive element claimed in claim 1, wherein the aforementioned ferromagnetic layers contain a first layer comprising Co-based amorphous alloy and a second layer different from the first layer in terms of at least one magnetic property selected from coercive force and anisotropy magnetic field.

5. The magnetoresistive element claimed in claim 1, wherein the aforementioned ferromagnetic layers contain a first layer comprising a permanent magnet and a second layer different from the first layer in terms of at least one magnetic property selected from coercive force and anisotropy magnetic field.

6. The magnetoresistive element claimed in claim 1, wherein the thickness per layer of the aforementioned nonferromagnetic layers is 4 to 10 nm.

7. The magnetoresistive element claimed in claim 1, wherein the thickness per layer of the aforementioned ferromagnetic layers is 2 to 10 nm.

8. The magnetoresistive element claimed in claim 1, characterized by having two types of ferromagnetic layers which are a ferromagnetic layer with a relatively low coercive force and a ferromagnetic layer with a relatively high coercive force, wherein the angle between the easy axis directions of the two types of ferromagnetic layers is 75 to 90°.

9. The magnetoresistive element claimed in claim 1, characterized by having two types of ferromagnetic layers which are a ferromagnetic layer with a relatively low anisotropy magnetic field and a ferromagnetic layer with a relatively high anisotropy magnetic field, wherein the angle between the easy axis directions of the two types of ferromagnetic layers is 75 to 90°.

10. The magnetoresistive element claimed in claim 1, wherein magnetic interactions are present between the ferromagnetic layers and the thickness per layer of the nonferromagnetic layers is 1.5 to 2.5 nm.

11. The magnetoresistive element claimed in claim 1, wherein a lattice mismatch between adjacent ferromagnetic layers and nonferromagnetic layers is at most 5%.

12. A magnetoresistive element, comprising a multilayer film having ferromagnetic layers and nonferromagnetic layers layered on each other, wherein a nonferromagnetic metal layer is formed through a nonferromagnetic insulating layer, so that a current flowing in the nonferromagnetic metal layer induces a bias field which is applied to the multilayer film.

13. The magnetoresistive element claimed in claim 12, wherein the aforementioned ferromagnetic layers contain a first layer comprising Ni or Ni alloy and a second layer different from the first layer in terms of at least one magnetic property selected from coercive force and anisotropy magnetic field.

14. The magnetoresistive element claimed in claim 12, wherein the aforementioned ferromagnetic layers contain a first layer comprising Co-based amorphous alloy and a second layer different from the first layer in terms of at least one magnetic property selected from coercive force and anisotropy magnetic field.

15. The magnetoresistive element claimed in claim 12, wherein the aforementioned ferromagnetic layers contain a first layer comprising a permanent magnet and a second layer different from the first layer in terms of at least one magnetic property selected from coercive force and anisotropy magnetic field.

16. The magnetoresistive element claimed in claim 12, wherein the thickness per layer of the aforementioned nonferromagnetic layers is 4 to 10 nm.

17. The magnetoresistive element claimed in claim 12, wherein the thickness per layer of the aforementioned ferromagnetic layers is 2, to 10 nm.

18. The magnetoresistive element claimed in claim 12, characterized by having two types of ferromagnetic layers which are a ferromagnetic layer with a relatively low coercive force and a ferromagnetic layer with a relatively high coercive force, wherein the angle between the easy axis directions of the two types of ferromagnetic layers is 75 to 90°.

19. The magnetoresistive element claimed in claim 12, characterized by having two types of ferromagnetic layers which are a ferromagnetic layer with a relatively low anisotropy magnetic field and a ferromagnetic layer with a relatively high anisotropy magnetic field, wherein the angle between the easy axis directions of the two types of ferromagnetic layers is 75 to 90°.

20. The magnetoresistive element claimed in claim 12, wherein magnetic interactions are present between the ferromagnetic layers and the thickness per layer of the nonferromagnetic layers is 1.5 to 2.5 nm.

21. The magnetoresistive element claimed in claim 12, wherein a lattice mismatch between adjacent ferromagnetic layers and nonferromagnetic layers is at most 5%.

22. A magnetoresistive element, comprising a multilayer film having ferromagnetic layers and nonferromagnetic layers layered on each other, and means for applying a bias field to the multilayer film so that an angle between a magnetization direction of the multilayer film and a direction for detecting an external magnetic field to be detected by said magnetoresistive element is 30 to 70° when no external magnetic field is detected.

23. The magnetoresistive element claimed in claim 22, wherein the aforementioned ferromagnetic layers contain a first layer comprising Ni or Ni alloy and a second layer different from the first layer in terms of at least one magnetic property selected from coercive force and anisotropy magnetic field.

24. The magnetoresistive element claimed in claim 22, wherein the aforementioned ferromagnetic layers contain a first layer comprising Co-based amorphous alloy and a second layer different from the first layer in terms of at least one magnetic property selected from coercive force and anisotropy magnetic field.

25. The magnetoresistive element claimed in claim 22, wherein the aforementioned ferromagnetic layers contain a first layer comprising a permanent magnet and a second layer different from the first layer in terms of at least one magnetic property selected from coercive force and anisotropy magnetic field.

26. The magnetoresistive element claimed in claim 22, wherein the thickness per layer of the aforementioned nonferromagnetic layers is 4 to 10 nm.

27. The magnetoresistive element claimed in claim 22, wherein the thickness per layer of the aforementioned ferromagnetic layers is 2 to 10 nm.

28. The magnetoresistive element claimed in claim 22, characterized by having two types of ferromagnetic layers which are a ferromagnetic layer with a relatively low coercive force and a ferromagnetic layer with a relatively high coercive force, wherein the angle between the easy axis directions of the two types of ferromagnetic layers is 75 to 90°.

29. The magnetoresistive element claimed in claim 22, characterized by having two types of ferromagnetic layers which are a ferromagnetic layer with a relatively low anisotropy magnetic field and a ferromagnetic layer with a relatively high anisotropy magnetic field, wherein the angle between the easy axis directions of the two types of ferromagnetic layers is 75 to 90°.

30. The magnetoresistive element claimed in claim 22, wherein magnetic interactions are present between the ferromagnetic layers and the thickness per layer of the nonferromagnetic layers is 1.5 to 2.5 nm.

31. The magnetoresistive element claimed in claim 22, wherein a lattice mismatch between adjacent ferromagnetic layers and nonferromagnetic layers is at most 5%.

32. A magnetoresistive device, comprising two magnetoresistive elements each including a multilayer film having ferromagnetic layers and nonferromagnetic layers layered on each other, wherein a difference in voltage between the two magnetoresistive elements generated by respective currents flowing therein is output to represent a voltage change due to a detected external magnetic field.

33. A magnetoresistive device as claimed in claim 32, each element further including a nonmagnetic metal layer formed through a nonferromagnetic insulating layer, so that a current flowing in the nonferromagnetic metal layer includes a bias field which is applied to the multilayer film.

34. A magnetoresistive device as claimed in claim 32, wherein an angle between a hard axis direction of each multilayer film and a direction for detecting an external magnetic field to be detected by the magnetoresistive device is 10° or less when no bias field is applied to either multilayer film.

35. A magnetoresistive device as claimed in claim 32, each element further including means for applying a bias field to a respective multilayer film so that an angle between a magnetization direction of the multilayer film to be detected by said magnetoresistive element is 30 to 70° when no external magnetic field is detected.

36. A magnetoresistive element, comprising a multilayer film having ferromagnetic layers and nonferromagnetic layers layered on each other, wherein an angle between a hard axis direction of the multilayer film and a direction for detecting an external magnetic field to be detected by the magnetoresistive element is 10° or less when no bias field is applied to the multilayer film wherein the aforementioned ferromagnetic layers contain a first layer comprising a permanent magnet and a second layer different from the first layer in terms of at least one magnetic property selected from coercive force and anisotropy magnetic field.

* * * * *